US010128230B2

(12) United States Patent
Shirakawa et al.

(10) Patent No.: US 10,128,230 B2
(45) Date of Patent: Nov. 13, 2018

(54) SEMICONDUCTOR DEVICE

(71) Applicant: FUJI ELECTRIC CO., LTD., Kanagawa (JP)

(72) Inventors: Tohru Shirakawa, Matsumoto (JP); Hiroyuki Tanaka, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 17 days.

(21) Appl. No.: 15/684,962

(22) Filed: Aug. 24, 2017

(65) Prior Publication Data

US 2018/0076193 A1 Mar. 15, 2018

(30) Foreign Application Priority Data

Sep. 15, 2016 (JP) .................. 2016-180640

(51) Int. Cl.
*H01L 27/06* (2006.01)
*H01L 27/07* (2006.01)
*H01L 29/739* (2006.01)
*H01L 29/10* (2006.01)
*H01L 29/861* (2006.01)

(52) U.S. Cl.
CPC ...... *H01L 27/0623* (2013.01); *H01L 27/0727* (2013.01); *H01L 29/1004* (2013.01); *H01L 29/1095* (2013.01); *H01L 29/7391* (2013.01); *H01L 29/7395* (2013.01); *H01L 29/861* (2013.01); *H01L 2224/04042* (2013.01); *H01L 2924/13055* (2013.01)

(58) Field of Classification Search
CPC ............ H01L 27/0623; H01L 27/0727; H01L 29/1004
See application file for complete search history.

(56) References Cited

U.S. PATENT DOCUMENTS

2004/0207070 A1* 10/2004 Kaufmann ............ H01L 23/049
257/704
2005/0280053 A1* 12/2005 Hayes ................. H01L 29/4238
257/288
2012/0132954 A1* 5/2012 Kouno ................ H01L 29/0619
257/140

(Continued)

FOREIGN PATENT DOCUMENTS

JP H11-040822 A 2/1999
JP 2004-363328 A 12/2004

(Continued)

*Primary Examiner* — Errol Fernandes

(57) ABSTRACT

An RC-IGBT has a chip area of the semiconductor chip larger than that of a semiconductor chip including an IGBT section but not including an FWD section, as it is provided with the FWD section. It is demanded to reduce the chip area of the RC-IGBT semiconductor chip. Provided is a semiconductor device including: a transistor section including a plurality of transistors; a free wheeling diode section being at least opposite to one side of the transistor section and provided outside the transistor section, when the transistor section is seen from a top view; and a gate runner section and a gate pad section provided to contact the transistor section and not surrounding an entire periphery of the transistor section, when the transistor section is seen from a top view.

14 Claims, 25 Drawing Sheets

(56) References Cited

U.S. PATENT DOCUMENTS

| | | | |
|---|---|---|---|
| 2013/0087829 A1* | 4/2013 | Tanabe | H01L 29/66348 257/140 |
| 2015/0108501 A1* | 4/2015 | Iwamuro | H01L 29/1608 257/77 |
| 2015/0171199 A1 | 6/2015 | Senoo | |
| 2016/0043073 A1* | 2/2016 | Tamura | H01L 27/0664 257/140 |
| 2016/0141400 A1 | 5/2016 | Takahashi | |
| 2017/0077217 A1* | 3/2017 | Ogawa | H01L 29/0615 |

FOREIGN PATENT DOCUMENTS

| | | |
|---|---|---|
| JP | 2015-118989 A | 6/2015 |
| JP | 2016-096222 A | 5/2016 |

\* cited by examiner

SEMICONDUCTOR DEVICE

The contents of the following Japanese patent application are incorporated herein by reference:
NO. 2016-180640 filed in JP on Sep. 15, 2016.

BACKGROUND

1. Technical Field

The present invention relates to a semiconductor device.

An RC-IGBT (Reverse Conducting-IGBT) is known of which an IGBT (Insulated Gate Bipolar Transistor) and an FWD (Free Wheeling Diode) are provided on one semiconductor substrate. Conventionally, when seen from a top view, the semiconductor device is provided with the IGBT section and the FWD section such that the IGBT section and the FWD section are arranged alternately to form a striped pattern or the IGBT section surrounds a plurality of FWD sections (for example, refer to Patent Document 1). Also, a gate runner is provided to surround the IGBT section (for example, refer to Patent Document 2).

Patent Document 1: Japanese Patent Application Publication No. 2016-96222
Patent Document 2: Japanese Patent Application Publication No. 2004-363328

An RC-IGBT has a chip area of the semiconductor chip larger than that of a semiconductor chip including an IGBT section but not including an FWD section, as it is provided with the FWD section. It is demanded to reduce the chip area of the RC-IGBT semiconductor chip.

SUMMARY

In a first aspect of the present invention, provided is a semiconductor device. The semiconductor device may include a transistor section, a free wheeling diode section, a gate runner section and a gate pad section. The transistor section may include a plurality of transistors. The free wheeling diode section may be at least opposite to one side of the transistor section and provided outside the transistor section, when the transistor section is seen from a top view. The gate runner section and the gate pad section may be provided to contact the transistor section and may not surround an entire periphery of the transistor section, when the transistor section is seen from a top view.

The free wheeling diode section may not be provided inside the transistor section, when the transistor section is seen from a top view.

The free wheeling diode section may be provided serially outside the transistor section, the gate runner section and the gate pad section, when the transistor section is seen from a top view.

The free wheeling diode section may also be shaped to have a notch on one side of four sides of a rectangular ring shape.

The free wheeling diode section may be provided to surround the entire periphery of the transistor section.

The semiconductor device may further include an edge termination section. The edge termination section may be positioned outside the free wheeling diode section, when the transistor section is seen from a top view. The free wheeling diode section may include an emitter trench section at a position which overlaps with an insulating film extending from the edge termination section.

The semiconductor device may further include a wiring section. The wiring section may electrically communicate with outside of the semiconductor device. The wiring section may be provided inside the transistor section, when the transistor section is seen from a top view.

The semiconductor device may further include a semiconductor substrate and a solder layer. The semiconductor substrate may be provided with the transistor section and the free wheeling diode section. The solder layer may be provided to directly contact a back surface electrode and a side surface of the semiconductor substrate. The back surface electrode may be provided on a back surface of the semiconductor substrate. A thickness W of the semiconductor substrate and a height T of the solder layer on the back surface of the semiconductor substrate at the side surface of the semiconductor substrate may satisfy a relationship of $W/2<T$.

A protruding length X of the solder layer protruding from the side surface to the outside of the semiconductor substrate, when the transistor section is seen from a top view, and the height T of the solder layer may satisfy a relationship of $T<X$.

The free wheeling diode section may include an n-type cathode layer extending to the edge termination section.

The edge termination section may include a p-type collector layer smaller than a width of the edge termination section.

A width of the p-type collector layer of the edge termination section may be smaller than a thickness of the semiconductor substrate provided with the transistor section and the free wheeling diode section.

A boundary region between the transistor section and the free wheeling diode section may have a total length 3.0 times or less greater than a length of one side of the semiconductor device.

The summary clause does not necessarily describe all necessary features of the embodiments of the present invention. The present invention may also be a sub-combination of the features de scribed above.

DESCRIPTION OF EXEMPLARY EMBODIMENTS

Hereinafter, the present invention is described through the embodiments of the invention. However, the following embodiments do not limit the claimed inventions. Also, all of combinations of features described in the embodiments are not necessarily required for solutions of the invention.

Figure 1:
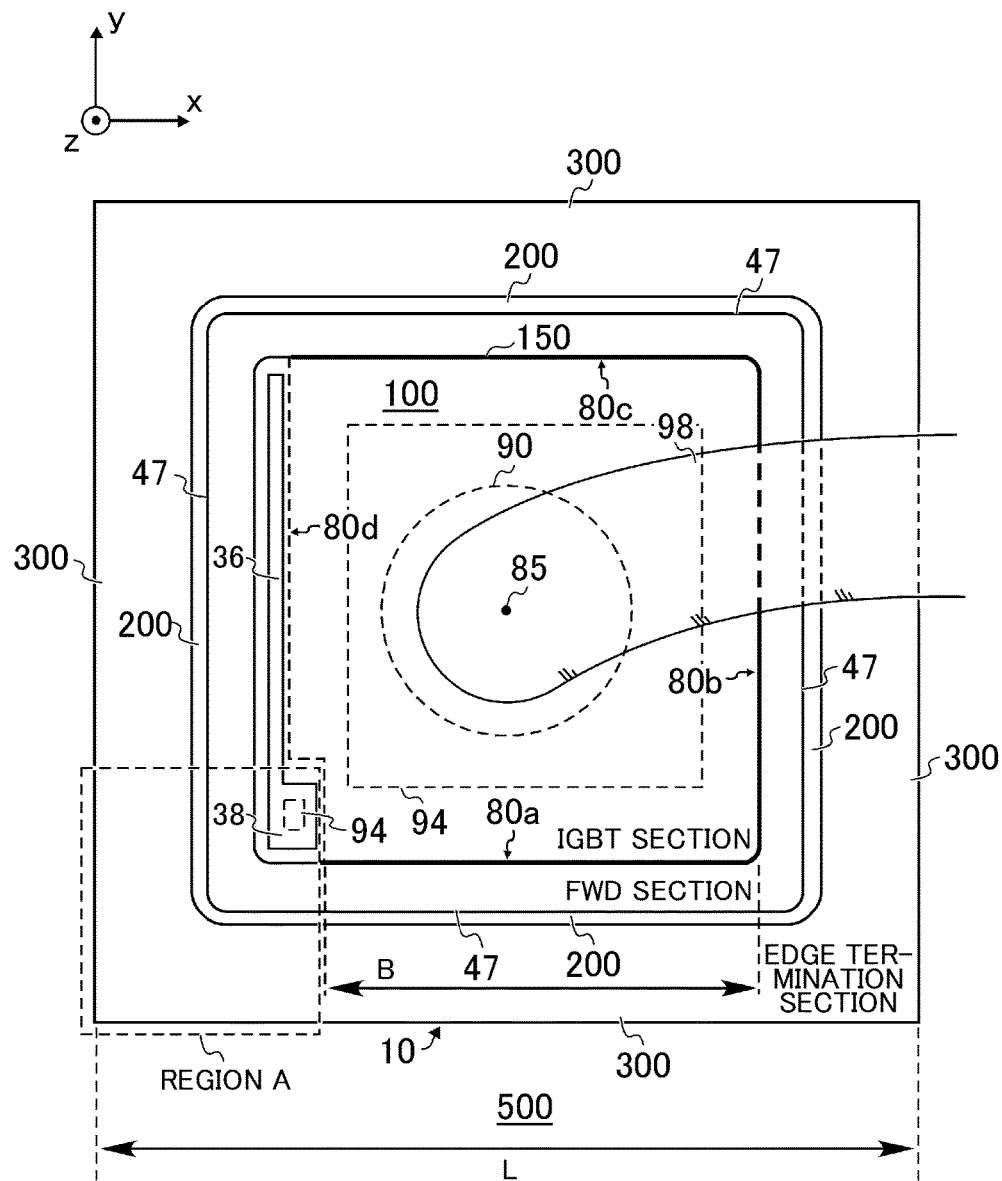
FIG. 1 is a top view of a semiconductor device 500 in a first embodiment.

FIG. 1 is a top view of a semiconductor device 500 in a first embodiment. Note that when the semiconductor device 500 is seen from a top view refers to when the IGBT section 100 is seen from a top view. In FIG. 1, in order to describe a positional relationship between components, a film, a layer, an electrode and the like provided on a front surface of a semiconductor substrate 10 are removed as appropriate. Note that an opening 94 is described with reference to FIG. 2, symbols "B" and "L" are described with reference to FIG. 6A and the like.

In the present example, the x direction and the y direction are directions vertical to each other, and the z direction is a direction vertical to the x-y plane. The x direction, the y direction and the z direction form a so-called right-handed system. The semiconductor substrate 10 of the present example has a front surface at an end portion in the +z direction and a back surface at an end portion in the −z direction. Note that in the present example, "on" and "under" are merely representations convenient for describing a relative positional relationship. The z direction does not necessarily mean a direction vertical to the gravity direction or the ground.

The semiconductor device 500 is provided on the semiconductor substrate 10. The semiconductor device 500 of the present example includes an IGBT section 100, a free wheeling diode section (hereinafter referred to as an FWD section, for short) 200, a gate runner section 36 and a gate pad section 38, and an edge termination section 300.

When the semiconductor device 500 is seen from a top view, the IGBT section 100 has a rectangular shape. The rectangular shape of the present example includes four sides 80a to 80d. The side 80a and the side 80c of the present example are sides 80 parallel to the x direction. Also, the side 80b and the side 80d of the present example are sides 80 parallel to the y direction. In the IGBT section 100, an angle formed by adjacent two sides 80 may not be a right angle. In the present example, the side 80a and the side 80b do not form a right angle, but are connected to each other via a smooth curve. The same is applied to the side 80b and the side 80c.

The IGBT section 100 of the present example is one example of the transistor section. The IGBT section 100 includes a plurality of IGBTs. Note that a unit configuration of IGBTs is described below. Note that an MOSFET (Metal Oxide Semiconductor Field Effect Transistor) section may also be used instead of the IGBT section 100. The MOSFET section may include a plurality of MOSFETs. The IGBT section 100 and the MOSFET section may be so-called vertical transistors which cause a current to flow in the z direction.

The FWD section 200 of the present example is provided outside the IGBT section 100. Note that in the present example, "outside" means being positioned relatively apart from a center 85 of the rectangular semiconductor substrate 10 on the x-y plane. On the other hand, "inside" means being positioned relatively close to the center 85. In the present example, the FWD section 200 is not provided inside the IGBT section 100.

The FWD section 200 may be at least opposite to one side 80 of the IGBT section 100. The FWD section 200 of the present example is provided opposite to different four sides 80 of the IGBT section 100 to surround an entire periphery of the IGBT section 100. The FWD section 200 of the present example contacts three sides 80a, 80b and 80c of the IGBT section 100. A boundary region 150 at which the FWD section 200 and the IGBT section 100 contact each other is illustrated by bold lines. Also, the FWD section 200 of the present example is provided serially outside the IGBT section 100, the gate runner section 36 and the gate pad section 38.

The gate runner section 36 and the gate pad section 38 are provided to contact the IGBT section 100. The gate runner section 36 and the gate pad section 38 of the present example do not surround the entire periphery of the IGBT section 100. The gate runner section 36 and the gate pad section 38 of the present example are provided between the side 80d of the IGBT section 100 and the FWD section 200.

A region immediately under the gate runner section 36 and the gate pad section 38 needs to be provided with a p-type well region or a p-type semiconductor layer which includes a gate trench. On the other hand, in the present example, the gate runner section 36 and the gate pad section 38 are not provided to surround the entire periphery of the IGBT section 100. Therefore, the p-type well region or the p-type semiconductor layer which does not include the gate trench section can be used as the FWD section 200. Therefore, as compared to the case in which the gate runner section 36 and the gate pad section 38 surround the entire periphery of the IGBT section 100, a chip area of the semiconductor device 500 can be reduced.

The edge termination section 300 may be provided to surround an entire periphery of the FWD section 200. The edge termination section 300 is positioned from an outermost side of the FWD section 200 to an end portion of the semiconductor substrate 10. Also, the edge termination section 300 may include an edge termination structure such as a guard ring structure and a channel stopper.

The IGBT section 100 includes an emitter electrode above an entire front surface of the semiconductor substrate 10. The emitter electrode of the present example includes a wiring region 90 in its inner side. While the wiring region 90 of the present example has a circular shape, the wiring region 90 may have a shape similar to a contour of the FWD section 200. The center of the wiring region 90 may be positioned at the center 85. The wiring region 90 is provided with a wiring section 98 electrically communicating with the outside of the semiconductor device 500. The wiring section 98 may be one or more bonding wires, or may be one or more lead frames. The bonding wire and the lead frame of the present example are formed of metal material having good electrical conductivity and thermal conductivity. Also, the emitter electrode of the present example may include an emitter electrode outer circumferential end 47, as shown in FIG. 1.

The FWD section 200 of the present example is provided to have a rectangular ring shape. Therefore, a heat generated during an operation of the FWD section 200 can be conveyed inside and outside. In the present example, the wiring region 90 is provided at a position which includes the center 85. Therefore, a heat generated in the FWD section 200 can be released evenly from the wiring section 98 having a high thermal conductivity. Therefore, in the FWD section 200 provided to have a rectangular ring shape, a heat can be released evenly at four sides thereof. This can prevent an imbalanced thermal resistance in the FWD section 200. Therefore, as compared to the case of an imbalanced thermal resistance, the present example is advantageous to reduce a failure rate of the semiconductor device 500 and extend a lifetime of the semiconductor device 500.

Figure 2:
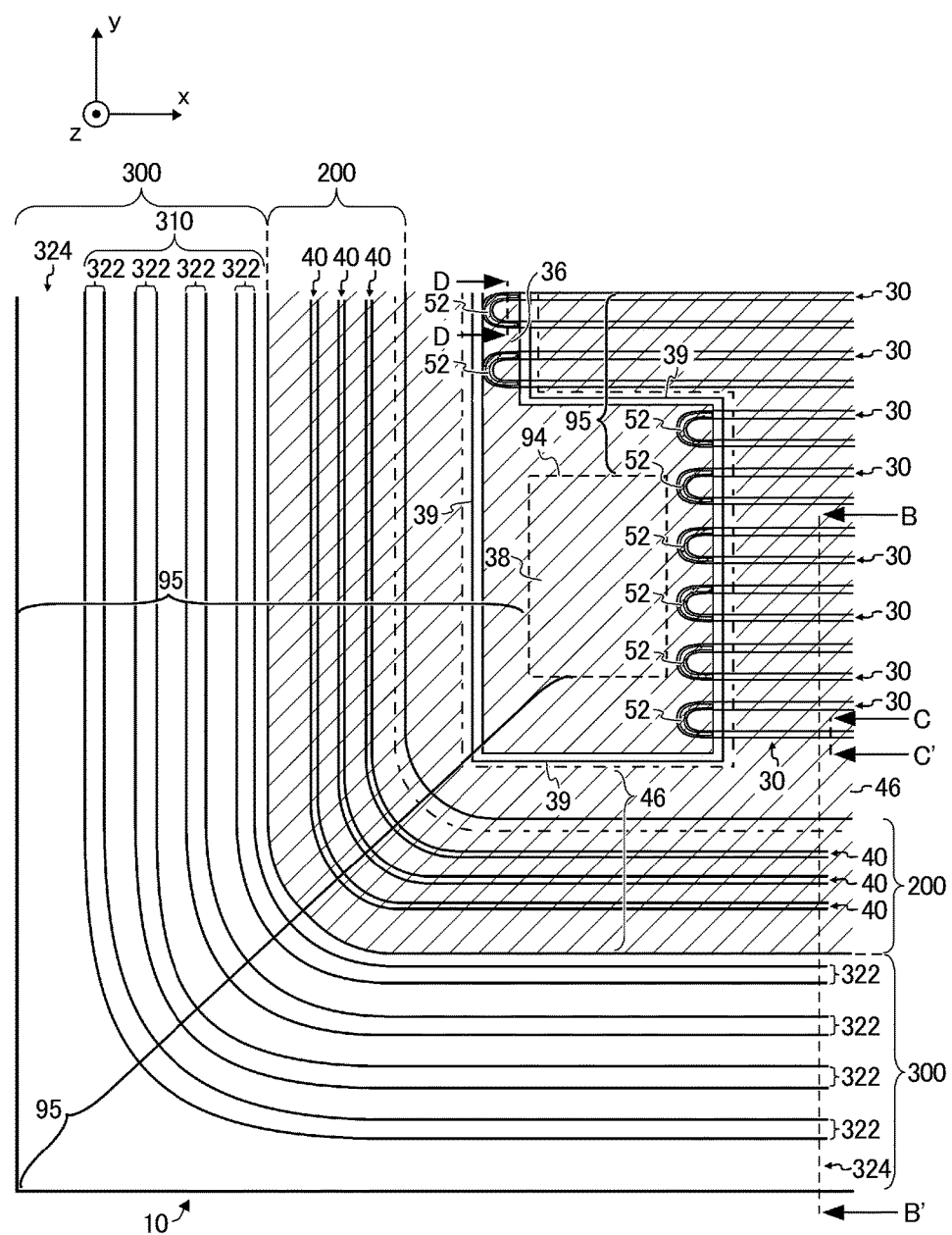
FIG. 2 is an enlarged view of a region A in FIG. 1.

FIG. 2 is an enlarged view of a region A in FIG. 1. The IGBT section 100 includes a plurality of gate trench sections 30. The gate trench section 30 of the present example includes a longitudinal portion which extends in the x direction. The longitudinal portion of the gate trench section 30 works as a gate of the IGBT. Two longitudinal portions may form a U shape immediately under the gate runner section 36 and the gate pad section 38 or may terminate in a straight shape.

Note that the gate trench section 30 is also positioned under the gate runner section 36 and the gate pad section 38.

A p$^+$-type well region 39 may be formed around the gate runner section 36 to have a depth greater than the gate trench section 30. The p$^+$-type well region 39 covers a trench bottom portion of a U-shape portion or a trench bottom portion of a straight-shape terminating portion of the gate trench section 30. This prevents a depletion layer from being formed at the U-shape portion or the straight-shape terminating portion, thereby preventing an electric field concentration.

An interlayer insulating film is provided between the gate trench section 30, and the gate runner section 36 and the gate pad section 38. The interlayer insulating film includes a plurality of openings 52. The opening 52 may have a shape which corresponds to the U-shape portion of the gate trench section 30. The opening 52 of the present example has a shape similar to the U-shape portion of the gate trench section 30 and smaller than the U-shape portion. The gate trench section 30, and the gate runner section 36 and the gate pad section 38 may electrically communicate with one another through metal plugs provided in the openings 52.

The gate runner section 36 may have a two-layer structure of a polysilicon film and an aluminum-silicon alloy film stacked on the polysilicon film. The polysilicon film of the gate runner section 36 is connected to polysilicon inside the gate trench section 30 via the opening 52. Alternatively, the gate runner section 36 may have a one-layer structure of an aluminum-silicon alloy film. In case of this one-layer structure, polysilicon inside the gate trench section 30 and the aluminum-silicon alloy film of the gate runner section 36 may be directly connected to each other via the opening 52.

An emitter electrode 46 is provided on the front surface of the semiconductor substrate 10. However, the emitter electrode 46 is not provided on the gate runner section 36 or the gate pad section 38. The emitter electrode 46 above the FWD section 200 and the emitter electrode 46 above the IGBT section 100 may be arranged serially. In the present example, the emitter electrode 46 is arranged to surround the gate runner section 36, and the emitter electrode 46 is formed serially at the boundary between the FWD section 200 and the IGBT section 100.

A passivation film 95 is provided on the uppermost surface of the semiconductor substrate 10. The passivation film 95 may cover the IGBT section 100, the FWD section 200, the edge termination section 300, and the gate runner section 36, and may partially cover a peripheral portion of the gate pad section 38. The passivation film 95 of the present example is a polyimide film.

The passivation film 95 includes a plurality of openings 94 in order to ensure that the semiconductor device 500 communicates with the outside. The passivation film 95 of the present example includes the opening 94 for the gate electrode on the gate pad section 38 which has an area smaller than the gate pad section 38 on the x-y plane. Note that the passivation film 95 of the present example does not include the opening 94 on the gate runner section 36. Also, the passivation film 95 also includes the opening 94 for the emitter electrode 46 at least at a position corresponding to the wiring region 90. In the present example, the opening 94 for the emitter electrode 46 has a rectangular shape.

The FWD section 200 may or may not include a plurality of emitter trench sections 40. Each of the emitter trench sections 40 of the present example is provided serially to surround the entire periphery of the IGBT section 100. The emitter trench section 40 may have a shape when seen from a top view similar to a contour of the FWD section 200 when seen from a top view. Each of the emitter trench sections 40 of the present example has a rectangular ring shape when seen from a top view. Note that the emitter trench sections 40 are described below in detail.

The edge termination section 300 of the present example includes a guard ring structure 310. The guard ring structure 310 includes a plurality of guard rings 322. Also, the edge termination section 300 of the present example includes a channel stopper region 324 outside the guard ring structure 310.

Figure 3A:
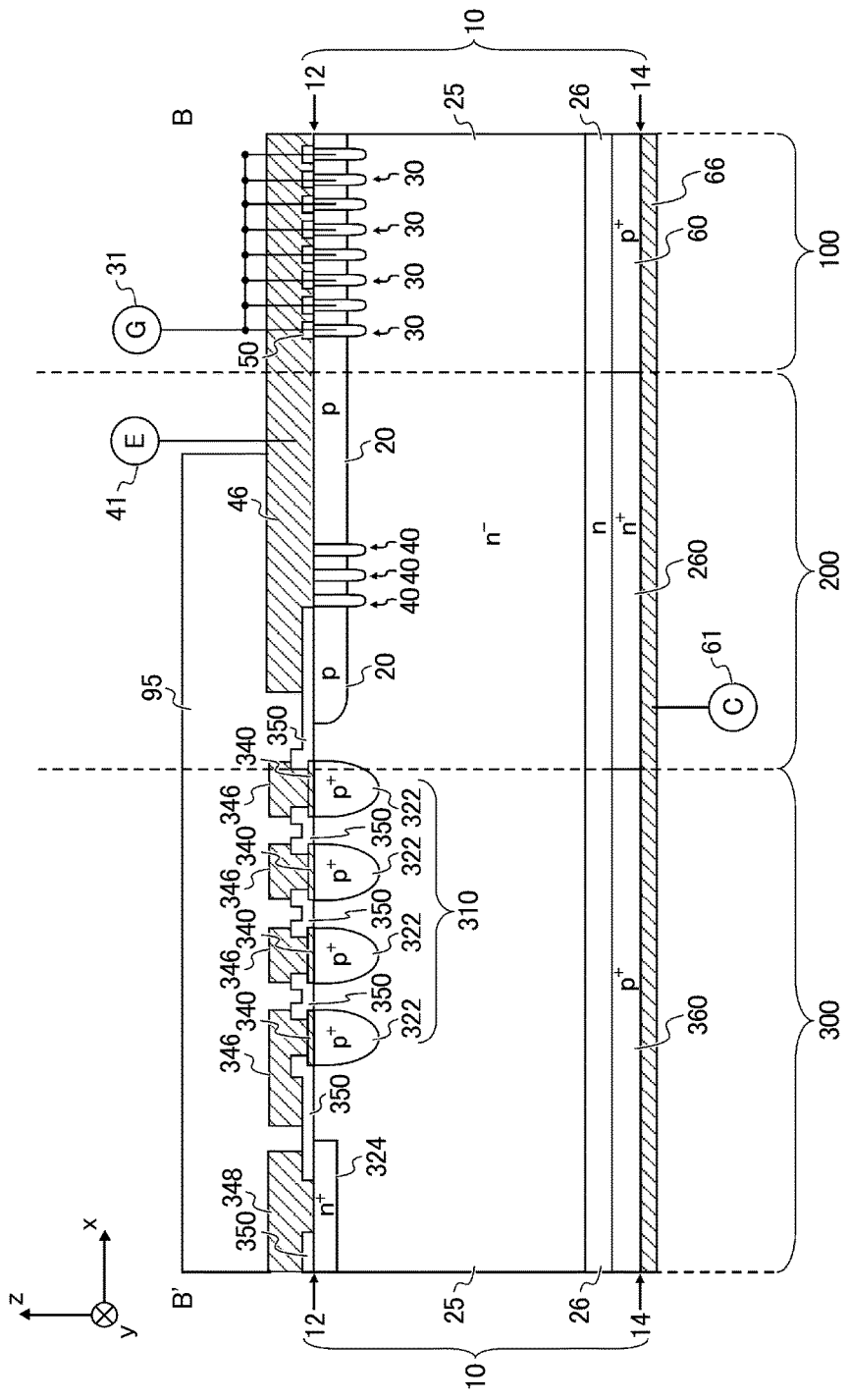
FIG. 3A is a cross sectional view along B-B' in FIG. 2.

FIG. 3A is a cross sectional view along B-B' in FIG. 2. The semiconductor substrate 10 is provided across the IGBT section 100, the FWD section 200 and the edge termination section 300. In the present example, one main surface of the semiconductor substrate 10 is referred to as a front surface 12. Also, the other main surface of the semiconductor substrate 10 is referred to as a back surface 14. The semiconductor substrate 10 of the present example is a silicon substrate. However, in another example, the semiconductor substrate 10 may also be a silicon carbide (SiC) substrate, a gallium nitride (GaN) substrate, or a gallium oxide (GaO) substrate.

The semiconductor substrate 10 of the present example includes a base region 20 of the p-type which extends from the front surface 12 to a predetermined depth position. The base region 20 of the present example is provided in the IGBT section 100 and the FWD section 200. Also, the semiconductor substrate 10 of the present example includes a drift region 25 of the n$^-$-type which extends from the base region 20 to a predetermined depth position in the IGBT section 100 and the FWD section 200. Also, the semiconductor substrate 10 of the present example includes a drift region 25 which extends from the front surface 12 to a predetermined depth position in the edge termination section 300.

In the present example, the letter "n" or "p" means the type including electrons or holes as major carrier, respectively. Also, the letter "n" or "p" may be accompanied by the superscript "+" or "−" at its right side. The letter with "+" means a higher carrier concentration than the letter without "+", while the letter with "−" means a lower carrier concentration than the letter without "−".

In the IGBT section 100 and the FWD section 200, the gate trench section 30 and the emitter trench section 40 are provided to penetrate the base region 20. That is, ends of the gate trench section 30 and the emitter trench section 40 reach the drift region 25.

An interlayer insulating film 50 is provided on the gate trench section 30. Also, the emitter electrode 46 is provided on the base region 20. The interlayer insulating film 50 electrically isolates the gate electrode and the emitter electrode 46 of the gate trench section 30. A gate terminal 31 is electrically connected to the gate trench section 30 through the gate pad section 38. Note that the gate trench sections 30 are described below in detail. Also, an emitter terminal 41 is electrically connected to the emitter electrode 46 through the wiring region 90. The wiring section 98 shown in FIG. 1 is one example of the emitter terminal 41.

In the FWD section 200, the emitter electrode 46 is also provided on the base region 20. The emitter electrode 46 of the FWD section 200 works as an anode electrode. The FWD section 200 includes the FWD formed by a p-n joint between the base region 20 of the p-type and the drift region 25 of the n⁻-type. The FWD of the FWD section 200 is connected back-to-back to the IGBT of the IGBT section 100 and causes a free wheeling current to flow when the IGBT is OFF.

The guard ring structure 310 of the edge termination section 300 may have a function to expand a depletion layer generated in the IGBT section 100 and the FWD section 200 to an end portion of the semiconductor substrate 10. This can prevent an electric field concentration inside the semiconductor substrate 10. This can increase a breakdown voltage of the semiconductor device 500, as compared to the one not provided with the guard ring structure 310.

A guard ring 322 of the p⁺-type of the present example is electrically connected to an electrode layer 346 via a polysilicon layer 340. A plurality of guard rings 322 are electrically insulated with one another by an insulating film 350. The channel stopper region 324 of the n⁺-type is electrically connected to an electrode layer 348 through an opening of the insulating film 350. Note that the channel stopper region 324 may also be a semiconductor region of the p-type. The channel stopper region 324 has a function to terminate the depletion layer expanded from the guard ring 322 to the end portion of the semiconductor substrate 10.

A bottom portion of the guard ring 322 of the p⁺-type may be at the same depth as a depth of a bottom portion of the p⁺-type well region 39. Also, a bottom portion of the guard ring 322 of the p⁺-type may be at a depth greater than a depth of a bottom portion of the gate trench section 30 or the emitter trench section 40. The depth of the bottom portion of the p⁺-type well region 39 of the present example is greater than the depths of the bottom portion of the gate trench section 30 and the emitter trench section 40.

In the present example, the emitter electrode 46, the electrode layer 346 and the electrode layer 348 may be an alloy of aluminum and silicon (for example, an Al—Si alloy or an Al—Si—Cu alloy). Also, the insulating film 350 may be a silicon dioxide film, and may further include an interlayer insulating film formed of other material on silicon dioxide (for example, a BPSG film).

The semiconductor substrate 10 of the present example includes an FS (Field Stop) layer 26 under the drift region 25. The FS layer 26 may be a semiconductor layer of the n-type. The FS layer 26 of the present example is provided in the IGBT section 100, the FWD section 200 and the edge termination section 300, in common.

The semiconductor substrate 10 of the present example includes a collector layer 60, a cathode layer 260 and a collector layer 360 under the FS layer 26. In the present example, the collector layer 60, the cathode layer 260 and the collector layer 360 are provided in the IGBT section 100, the FWD section 200 and the edge termination section 300, respectively. The collector layer 60 and the collector layer 360 are semiconductor layers of the p⁺-type. On the other hand, the cathode layer 260 is a semiconductor layer of the n⁺-type.

The semiconductor device 500 includes a collector electrode 66 as a back surface electrode, under the back surface 14. The collector electrode 66 is provided in the IGBT section 100, the FWD section 200 and the edge termination section 300, in common. Note that the collector electrode 66 works as a cathode in the FWD section 200. A collector terminal 61 may be electrically connected to the collector electrode 66.

Figure 3B:
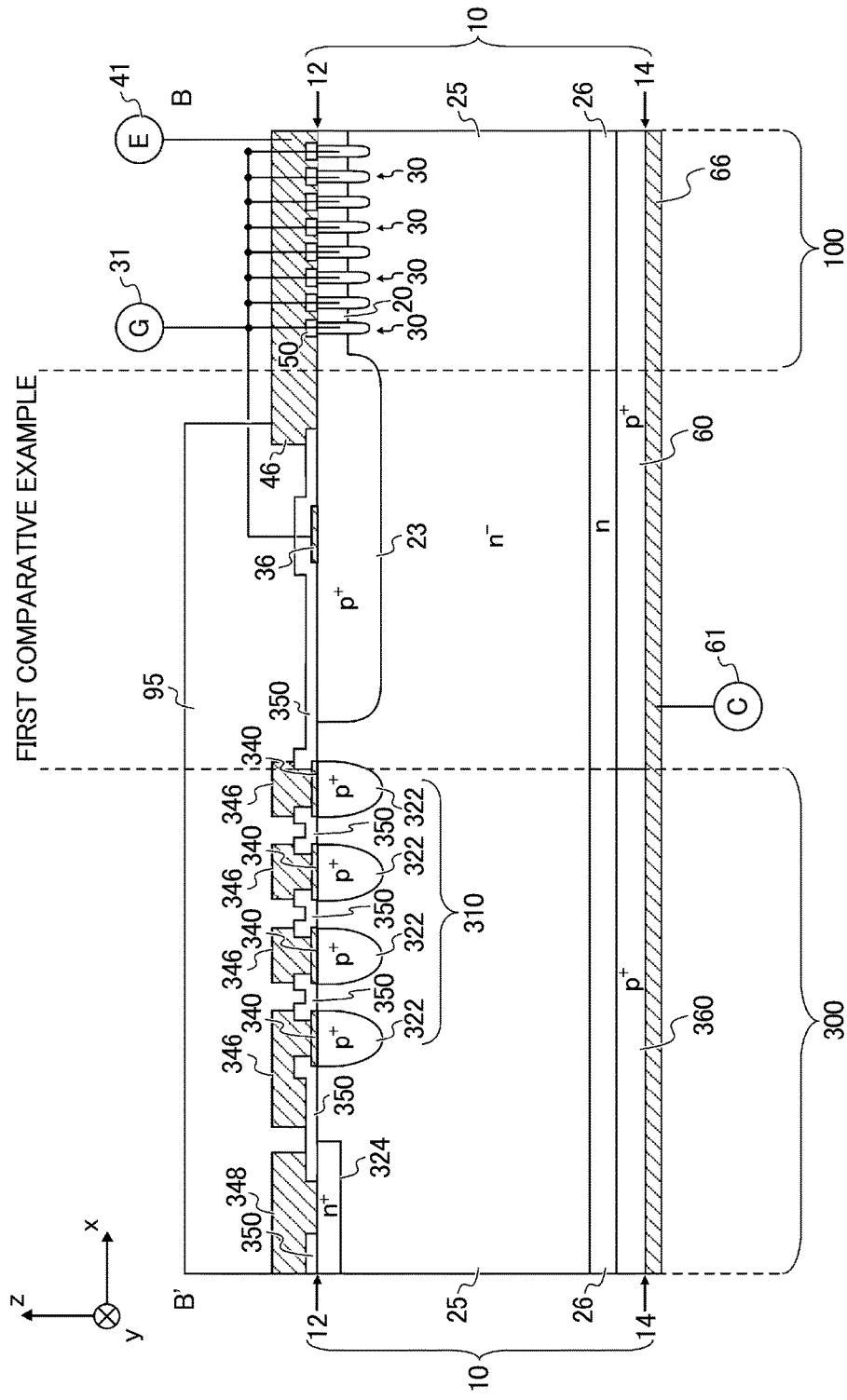
FIG. 3B is a cross sectional view of a first comparative example in which a gate runner section 36 is provided to surround an entire periphery of an IGBT section 100.

FIG. 3B is a cross sectional view of a first comparative example in which a gate runner section 36 is provided to surround an entire periphery of an IGBT section 100. The first comparative example includes a p⁺-type well region 23 immediately on which the gate runner section 36 and the gate pad section 38 are positioned. A gate electrode formed of polysilicon is provided immediately on the p⁺-type well region 23. The gate electrode is electrically connected to a gate electrode of the gate trench section 30.

On the other hand, in FIG. 3A (that is, in the first embodiment), the gate runner section 36 does not surround the entire periphery of the IGBT section 100. In the first embodiment, the gate runner section 36 and the gate pad section 38 are provided only between one side 80d of the IGBT section 100 and the FWD section 200. Therefore, in FIG. 3A, the p⁺-type well region 23 in the first comparative example of FIG. 3B may also be used as the FWD section 200.

Figure 4:
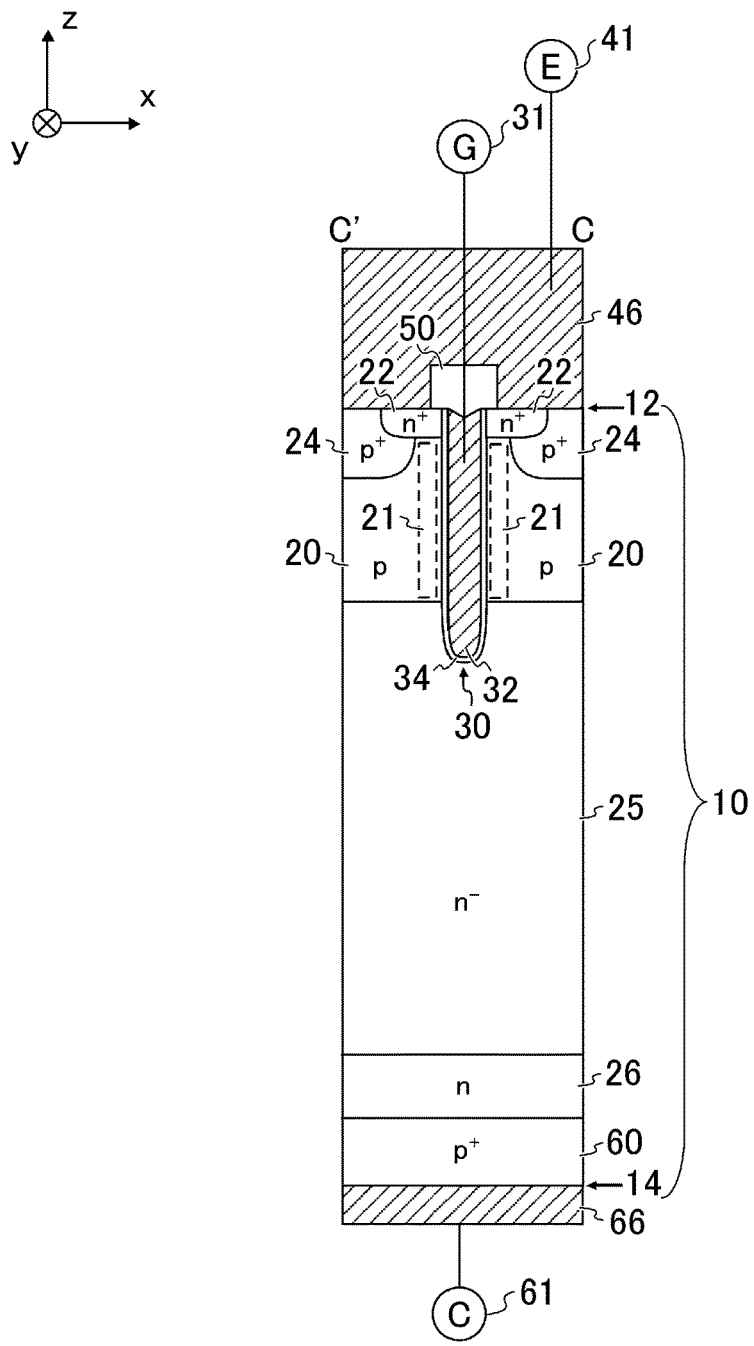
FIG. 4 is a cross sectional view along C-C' in FIG. 2.

FIG. 4 is a cross sectional view along C-C' in FIG. 2. In FIG. 4, a unit configuration of IGBTs is described. The gate trench section 30 includes a gate insulating film 34 and a gate electrode 32 in a trench. The gate insulating film 34 is provided to directly contact an inner wall of the trench. The inner wall may include a bottom surface and a side surface. The gate electrode 32 is provided to directly contact to the gate insulating film 34. That is, the inside of the trench is filled with the gate insulating film 34 and the gate electrode 32.

An emitter region 22 of the n⁺-type and a contact region 24 of the p⁺-type are provided to expose to the front surface 12. The emitter region 22 and the contact region 24 are provided at the both sides of the gate trench section 30 in the x direction. The emitter region 22 directly contacts the both sides of the gate trench section 30. On the other hand, the contact region 24 is separated from the gate trench section 30. In the base region 20, a region which contacts the gate trench section 30 works as a channel forming region 21.

Figure 5:
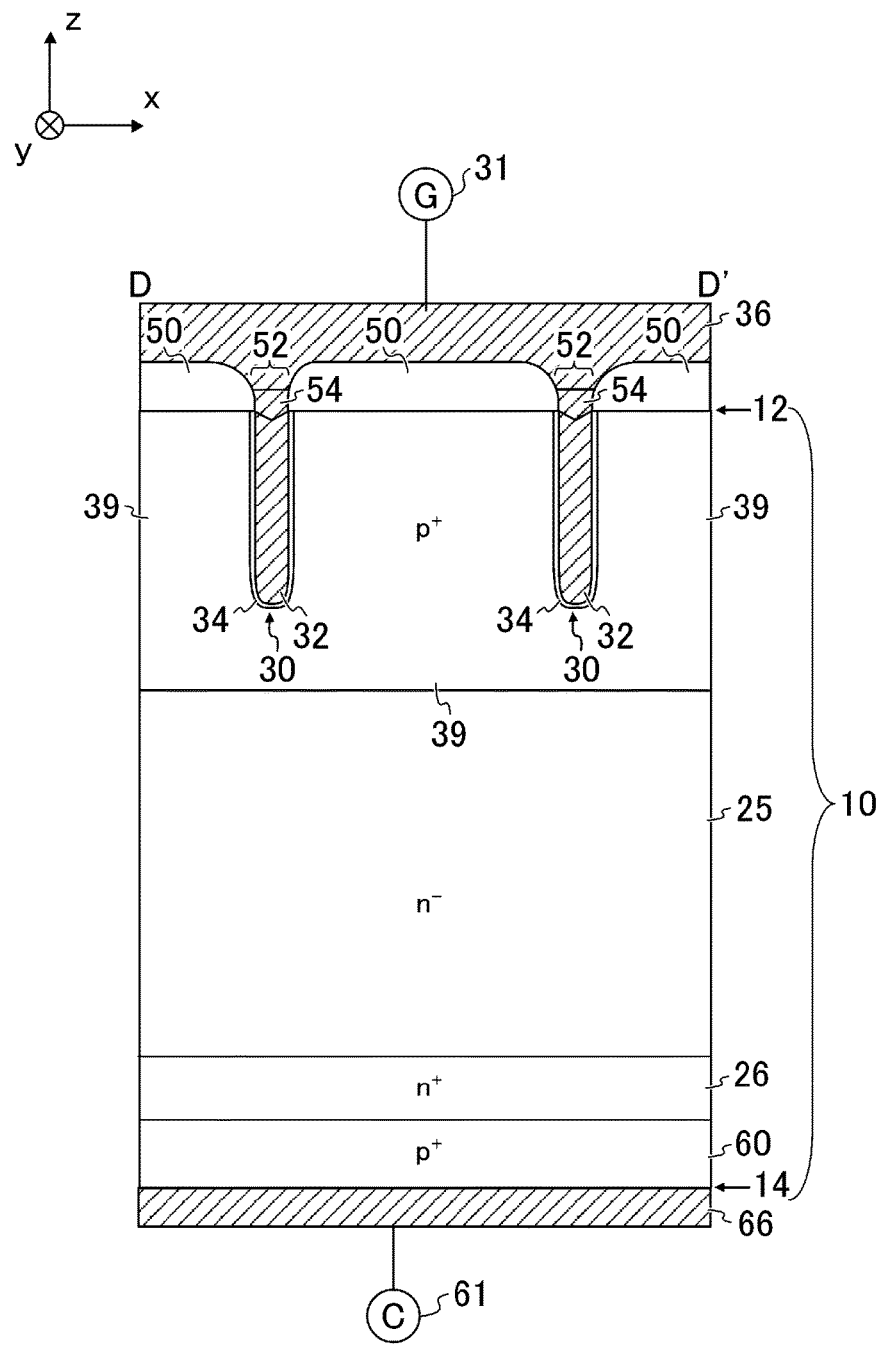
FIG. 5 is a cross sectional view along D-D' in FIG. 2.

FIG. 5 is a cross sectional view along D-D' in FIG. 2. In FIG. 5, the gate electrode 32 of the gate trench section 30 and the gate runner section 36 are directly connected to a plug 54 provided at the opening 52 of the interlayer insulating film 50. This allows the gate electrode 32 and the gate runner section 36 to be electrically connected to each other. It is desired that the plug 54 of the present example is formed of tungsten. However, the gate electrode 32 and the gate runner section 36 may also be electrically connected to each other not via the plug 54. Note that the gate trench section 30 and the gate pad section 38 are also electrically connected to each other via the plug 54 provided at the opening 52, in the same manner. The gate electrode 32 may be formed of polysilicon.

Figure 6A:
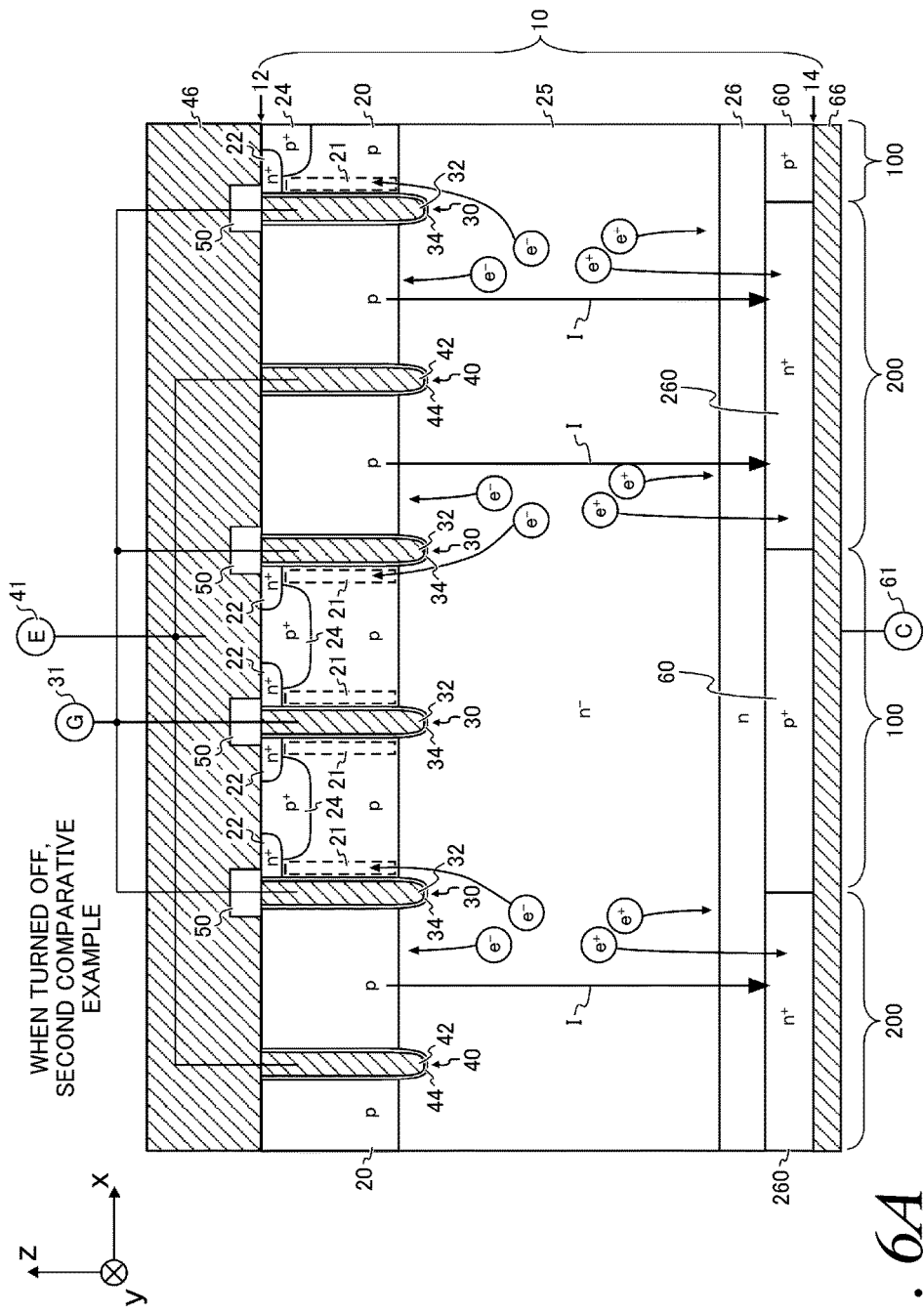
FIG. 6A is a diagram illustrating a second comparative example in which the IGBT section 100 and the FWD section 200 are alternately provided.
Figure 6B:
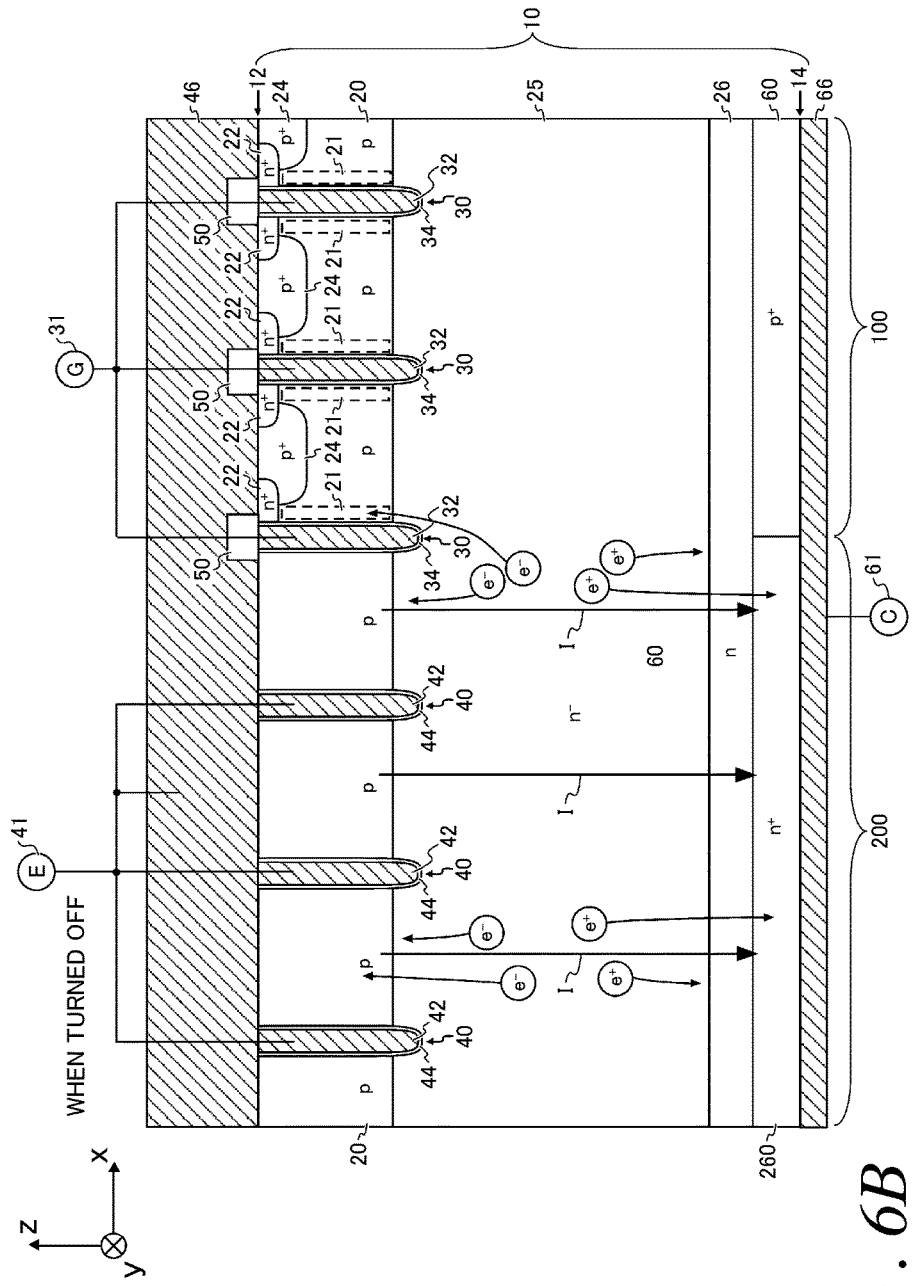
FIG. 6B is a diagram illustrating the IGBT section 100 and the FWD section 200 of the first embodiment.
Figure 6C:
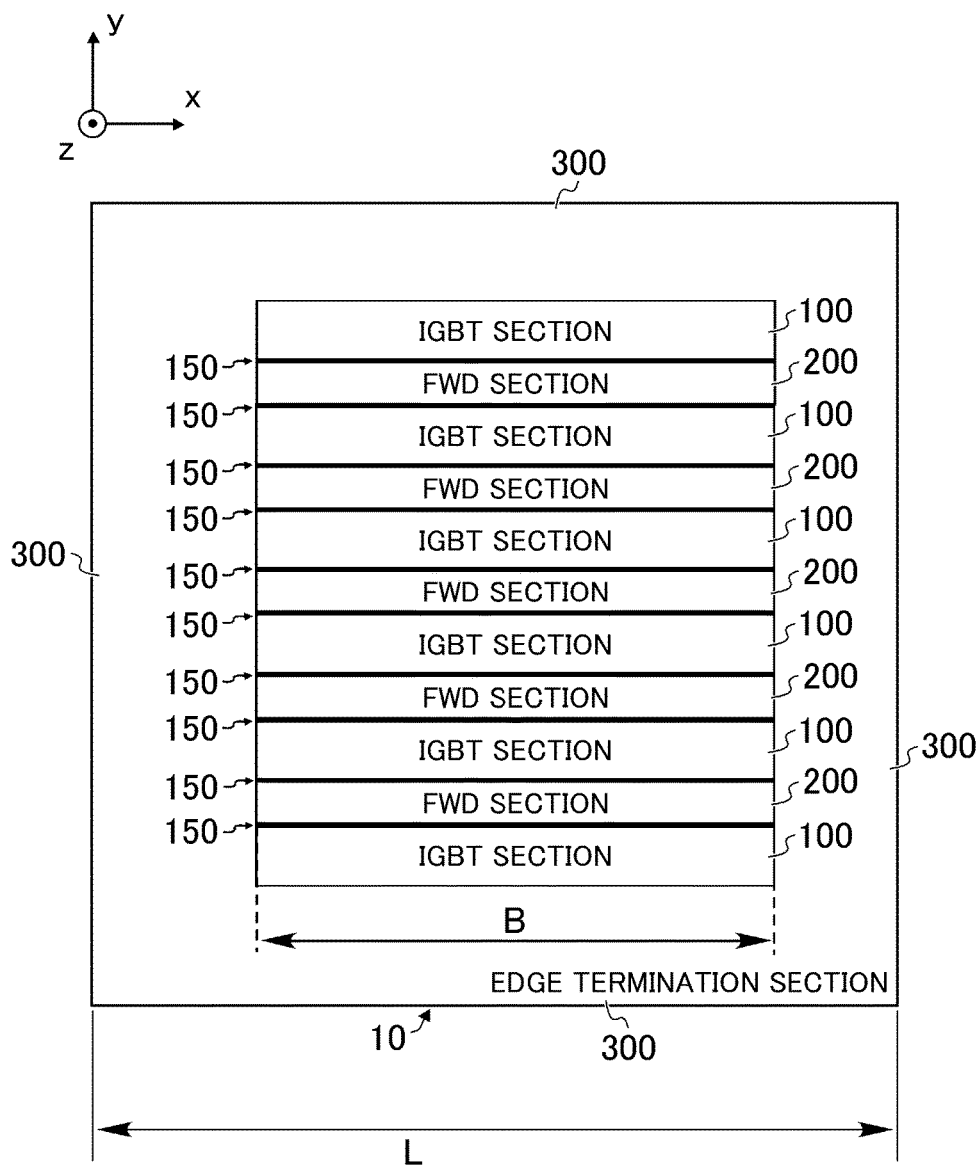
FIG. 6C is a top view of FIG. 6A.

FIG. 6A is a diagram illustrating a second comparative example in which the IGBT section 100 and the FWD section 200 are alternately provided. FIG. 6B is a diagram illustrating the IGBT section 100 and the FWD section 200 of the first embodiment. In FIG. 6A and FIG. 6B, a difference between the ON state and the OFF state of the IGBT immediately after switched from the ON state to the OFF state is described. Note that in the FWD section 200 in FIG. 6A and FIG. 6B, the emitter trench section 40 is provided which includes a trench electrode 42 and a trench insulating film 44. Also, in FIG. 6A and FIG. 6B, a circle with "e−" described therein schematically illustrates an electron while a circle with "e+" described "therein" schematically illustrates a hole. FIG. 6C is a top view of FIG. 6A. In FIG. 6C, in consideration of visibility of the figure, the IGBT section 100, the boundary region 150, the FWD section 200 and the edge termination section 300 are only illustrated.

Note that in the present embodiment and the comparative examples, a ground potential and a predetermined positive potential are applied to the emitter electrode 46 and the collector electrode 66, respectively. In the present embodiment and the comparative examples, the state in which a channel is formed in the channel forming region 21 by applying the predetermined positive potential to the gate electrode 32 is referred to as an ON state of the IGBT section 100. The state in which the channel disappears from the channel forming region 21 by applying the ground potential or a predetermined negative potential to the gate electrode 32 is referred to as an OFF state of the IGBT section 100. Note that when the IGBT section 100 is in the ON state or the OFF state is also merely referred to as when the IGBT section 100 is ON or OFF, respectively.

When the IGBT section 100 is ON, it causes a current to flow from the collector electrode 66 to the emitter electrode 46. On the other hand, when the IGBT section 100 is OFF, the IGBT section 100 does not cause a current to flow, but the FWD section causes a current to flow from the emitter electrode 46 to the collector electrode 66. In other words, when the gate of the IGBT section 100 is turned ON, an electron flows from the emitter electrode 46 to the collector electrode 66 of the IGBT section 100, while a hole flows from the collector electrode 66 to the emitter electrode 46. On the other hand, when the gate of the IGBT section 100 is turned OFF and when a free wheeling current flows in the semiconductor device 500, an electron flows from the collector electrode 66 to the emitter electrode 46 of the FWD section 200, while a hole flows from the emitter electrode 46 to the collector electrode 66.

When a free wheeling current flows in the semiconductor device 500, the gate of the IGBT section 100 may remain ON (that is, the channel forming region 21 may still exist). In FIG. 6A and FIG. 6B, the remaining channel forming region 21 is illustrated by dashed lines. An electron which flows in the FWD section 200 closest to the IGBT section 100 may enter the remaining channel forming region 21. In the second comparative example shown in FIG. 6A, the number of boundary portions between the IGBT section 100 and the FWD section 200 is greater than that of the first embodiment shown in FIG. 6B, and thus a greater number of electrons enter the remaining channel forming region 21.

This triggers a forward-direction voltage (hereinafter referred to as Vf) of the FWD section 200 in FIG. 6A to be higher than Vf of the FWD section 200 in FIG. 6B. The higher Vf is, the more difficult it is to cause a current to flow in the FWD section 200. Difficulty of flowing of currents in the FWD section 200 results in conduction loss in the FWD section 200. On the other hand, in the first embodiment in FIG. 6B, the FWD section 200 is provided to surround only outside of the IGBT section 100. Therefore, the boundary region 150 between the IGBT section 100 and the FWD section 200 is reduced, as compared to the cases in which the IGBT section 100 and the FWD section 200 are provided alternately to form a striped pattern or the IGBT section 100 and in which the FWD section 200 are provided such that the IGBT section 100 surrounds a plurality of FWD sections 200. Therefore, in the first embodiment shown in FIG. 6B, Vf can be set to be lower than in the second comparative example shown in FIG. 6A.

In the example of the present embodiment, the semiconductor device 500 is formed to have an approximately square shape in a planar view (when seen from a top view). One side of this square-shaped semiconductor device 500 is formed to have a length L. On the other hand, it is assumed that the semiconductor device 500 is provided with one or more boundary regions 150 between the IGBT section 100 and the FWD section 200, for example, n boundary regions 150. Among these boundary regions 150, given that the i-th (i is any one of 1 to n) boundary region 150 is Bi and the total length of all Bis is ß (ß=B1+B2+ . . . +Bi+ . . . +Bn), the length ß may be 3.0 times or less greater than the length L (that is, ß≤3.0 L).

For the second comparative example, for example, as shown in FIG. 6C, it is assumed that the semiconductor device includes six IGBT sections 100 and five FWD sections 200 which contact the IGBT sections 100 therein. In this case, the number of boundary regions 150 between the IGBT sections and the FWD sections is 10 in total. Given that a length of each of the IGBT sections 100 and the FWD sections 200 in the longitudinal direction is, for example, 0.7 L, the lengths Bi of the boundary regions 150 between the IGBT sections 100 and the FWD sections 200 are all the same as B=0.7 L. In addition, the total length α of the boundary regions 150 is α=10×B=7.0 L.

On the other hand, in the example of the present embodiment shown in FIG. 1, for example, the IGBT sections 100 and the FWD sections 200 are adjacent to one another at four positions. Here, for the IGBT section 100 and the FWD section 200 adjacent to each other via the gate runner section 36 positioned therebetween, boundary region 150 is not considered to exists therebetween because the IGBT section 100 and the FWD section 200 are sufficiently separated by the gate runner section 36. Therefore, the number of boundary regions 150 between the IGBT section 100 and the FWD section 200 of the present example is three. In other words, the boundary region 150 of the present example may also be referred to as the number of straight portions at which the IGBT section 100 and the FWD section 200 are directly adjacent to each other. Given that a length of each of three boundary regions 150 is B and B=0.7 L, the total length α of the boundary regions 150 is represented as α=3×B=2.1 L.

Shapes and arrangements of the IGBT section 100 and the FWD section 200 can be adjusted as appropriate. Therefore, the length Bi of each of the boundary regions 150 between the IGBT sections 100 and the FWD sections 200 may not be limited to 0.7 L with respect to the length L of one side of the semiconductor device 500, but may also be 0.5 L or more and 0.9 L or less. In this manner, even if the length Bi of each of the boundary regions 150 of the IGBT sections 100 and the FWD sections 200 is within a predetermined range, preferably, a is smaller than 3.0 times L to obtain an effect of lowering Vf. Further, a may be 2.5 times or less, may be 2.0 times or less, may be 1.5 times or less, or may be 1.0 times or less greater than L. Note that when there is only one boundary between the IGBT sections 100 and the FWD sections 200 and the length B1 of the boundary region 150 is approximately 0.5 L, the total length α of the boundary region 150 may also be considered the lower limit value. That is, a may be 0.5 times or more greater than L.

Note that in the example of the present embodiment, the semiconductor device 500 is formed to have an approximately square shape in a planar view, but the semiconductor device 500 may have a rectangular shape. When the semiconductor device has a rectangular shape, for example, for a longer side and a shorter side perpendicularly adjacent to this longer side of the semiconductor device, a value of the total length of the respective sides divided by two is defined as L.

Figure 7A:
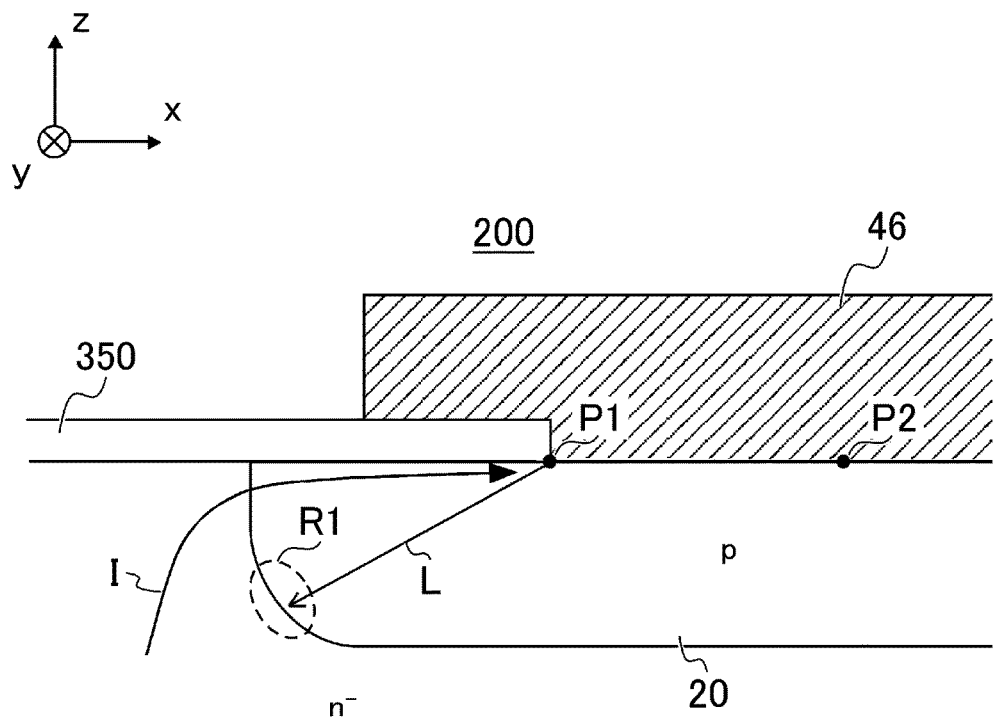
FIG. 7A is a diagram illustrating a third comparative example in which the FWD section 200 is not provided with the emitter trench section 40.
Figure 7B:
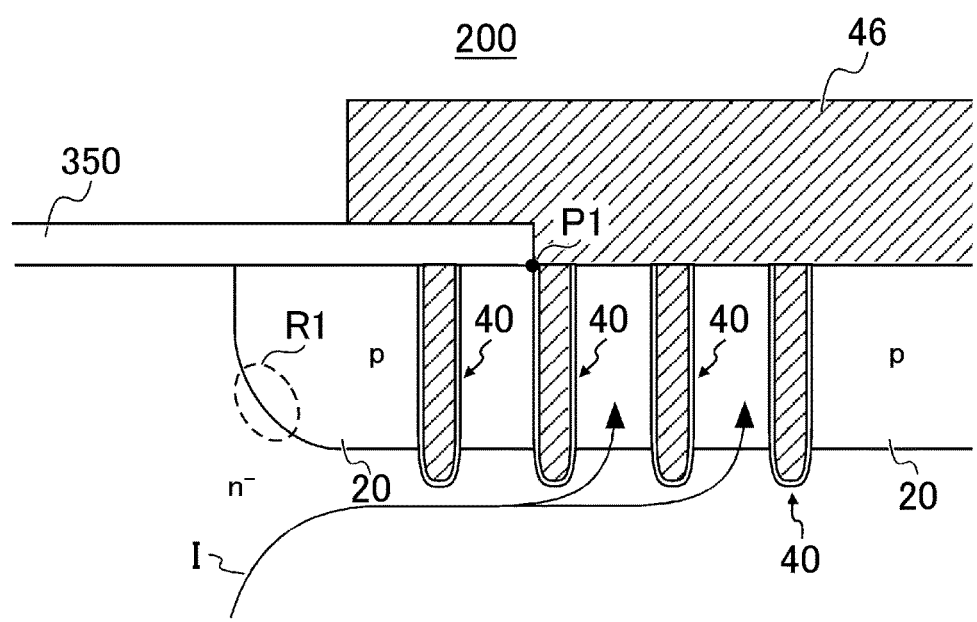
FIG. 7B is a diagram illustrating the first embodiment in which the FWD section 200 is provided with the emitter trench section 40.

FIG. 7A is a diagram illustrating a third comparative example in which the FWD section 200 is not provided with the emitter trench section 40. On the other hand, FIG. 7B is a diagram illustrating the first embodiment in which the FWD section 200 is provided with the emitter trench section 40. FIG. 7A and FIG. 7B illustrate enlarged views of the FWD section 200 in the vicinity of the boundary between the FWD section 200 and the edge termination section 300.

In FIG. 7A and FIG. 7B, the insulating film 350 extends from the edge termination section 300 to a position P1 in the FWD section 200. The position P1 is an end portion of a region in the x direction in which the insulating film 350 and the emitter region 22 overlaps with each other over a predetermined length in the x direction. The position P1 is positioned on the front surface 12. Note that the emitter electrode 46 directly contacts the front surface 12 over a predetermined range in the +x direction from the position P1.

As shown in FIG. 7A, when the IGBT section 100 is in the ON state, there is a current I (illustrated by an arrow) which flows from the collector electrode 66 of the edge termination section 300 to the emitter electrode 46 of the FWD section 200. This current I enters from an end portion of the base region 20 in the vicinity of the front surface 12 to the FWD section 200. For the sake of illustration, a position P2 positioned closer to the IGBT section 100 (more inside) than the position P1 is taken as an example. Comparing the position P2 with the position P1, the current I is subject to a higher resistance when it enters the emitter electrode 46 after flowing in the base region 20 until it reaches the position P2, than when it enters the emitter electrode 46 after flowing in the base region 20 until it reaches the position P1. Therefore, the current I necessarily passes the position P1. This causes the current I to concentrate on the position P1.

Also, when the IGBT section 100 is ON, an electric field particularly concentrates on an end portion region of a bottom portion of the emitter region 22 in the x direction (that is, a corner portion RD. The smaller a distance L between the region R1 in which an electric field concentration occurs and the position P1 at which a current concentration occurs is, the more likely an avalanche breakdown occurs.

On the other hand, the FWD section 200 in FIG. 7B includes the emitter trench section 40 which overlaps with the insulating film 350 in the z direction. The emitter trench section 40 just needs to be at least partially covered by the insulating film 350 on the front surface 12. In the emitter trench section 40 of the present example, the trench insulating film 44 of the emitter trench section 40 closest to the edge termination section 300 overlaps with the insulating film 350 at the position P1 in the z direction. Therefore, in the present example in FIG. 7B, the current I is subject to a higher resistance when it passes the position P1. Therefore, in FIG. 7B, the current I passes between the emitter trench sections 40, rather than the position P1. Therefore, in FIG. 7B, the distance L between the region R1 and the position P1 can be larger than in FIG. 7A, thereby suppressing occurrence of an avalanche breakdown.

Note that the emitter trench section 40 positioned at the outermost circumference may be formed below the insulating film 350 and may be insulated from the emitter electrode 46. In this case, the position P1 may be positioned between the adjacent emitter trench sections 40. If the emitter trench section 40 positioned at the outermost circumference is formed below the insulating film 350, the emitter trench section 40 positioned at the outermost circumference works as a barrier to prevent the current I from concentrating on the position P1. A plurality of emitter trench sections 40 may also be adjacent to the emitter trench section 40 positioned at the outermost circumference and insulated from the emitter electrode 46.

Next, one example of a manufacturing method of the semiconductor device 500 according to the first embodiment is described. However, the manufacturing method of the semiconductor device 500 is not limited to the present example. First, the semiconductor substrate 10 is prepared which is of the same n-type impurity concentration as that of the drift region 25. The n-type impurity concentration of the drift region 25 may be $2E+13$ $cm^{-3}$ or more and $5E+14$ $cm^{-3}$ or less.

Next, a thermal oxide film of approximately 8000 angstrom is formed by thermal oxidation. Subsequently, the thermal oxide film is removed from a predetermined region by etching to expose the semiconductor substrate 10. Subsequently, impurity doping and thermal diffusion are selectively performed on the semiconductor substrate 10 to form the guard ring 322 and the channel stopper region 324. The guard ring 322 of the $p^+$-type may include p-type impurities of $5.5E+18$ $cm^{-3}$ or more and $5.0E+19$ $cm^{-3}$ or less, while the channel stopper region 324 of the $n^+$-type may include n-type impurities of $1.0E+19$ $cm^{-3}$ or more and $1.0E+20$ $cm^{-3}$ or less. In the heating process, the semiconductor substrate 10 may be heated at 1150 degrees C. for two hours. Also, in the heating process, a thermal oxide film of approximately 4000 angstrom may also be formed at the same time.

Next, the semiconductor substrate 10 is etched to form contours of the gate trench section 30 and the emitter trench section 40. Next, impurity doping and thermal diffusion are selectively performed on the semiconductor substrate 10 to form the base region 20 of the p-type, the emitter region 22 of the $n^+$-type and the contact region 24 of the $p^+$-type.

First, in order to form the base region 20, p-type impurities of $1.5E+13$ $cm^{-2}$ or more and $3.5E+13$ $cm^{-2}$ or less are implanted and a heating process is performed at 1,100 degrees C. for two hours. Next, in order to form the contact region 24, p-type impurities of $1.0E+15$ $cm^{-2}$ or more and 3.0E+15 cm$^{-2}$ or less are implanted. Next, in order to form the emitter region 22, n-type impurities of 1.0E+15 cm$^{-2}$ or more and 5.0E+15 cm$^{-2}$ or less are implanted. Then, a heating process is performed on the semiconductor substrate 10 at 900 degrees C. or more and 1050 degrees C. or less for 0.5 hours. Note that a silicon dioxide film formed during the heating process may be used as the gate insulating film 34 and the trench insulating film 44. The silicon dioxide film may be form to have a thickness of approximately 1.2 μm.

Next, the gate electrode 32, the trench electrode 42 and the polysilicon layer 340 are formed by a CVD (chemical vapor deposition), an etching process and the like. In the present example, the gate electrode 32 and the trench electrode 42 are also formed of polysilicon.

Next, the insulating film 350 and the interlayer insulating film 50 are formed by a CVD, an etching process and the like. The insulating film 350 may be formed of silicon dioxide and the interlayer insulating film 50 may be formed of BPSG. The opening 52 is also formed by etching of the interlayer insulating film 50. Next, the plug 54 is shaped by performing sputtering and etching shaping on tungsten.

Next, the gate runner section 36, the gate pad section 38 and the polysilicon layer 340 are formed by a CVD, an etching process and the like. In the present example, the gate runner section 36, the gate pad section 38 and the polysilicon layer 340 are formed of polysilicon. Next, the emitter electrode 46 and the electrode layers 346 and 348 are formed by sputtering, an etching process and the like. The emitter electrode 46 and the electrode layers 346 and 348 of the present example are formed of an Al—Si alloy.

Next, the semiconductor substrate 10 is polished from the lower side to adjust the thickness of the semiconductor substrate 10 to be a predetermined thickness. The thickness of the semiconductor substrate 10 may be determined depending on the breakdown voltage of the semiconductor device 500. Next, the passivation film 95 is formed by coating. The passivation film 95 may be a polyimide film having a thickness of 5 μm or more and 15 μm or less.

Next, n-type impurities are doped from the back surface 14 of the semiconductor substrate 10 to form the FS layer 26 of the n$^+$-type. For example, the semiconductor substrate 10 is implanted with ions of protons of different dose amounts of approximately 1.0E+12 cm$^{-2}$ or more and 5.0E+14 cm$^{-2}$ or less, multiple times from the back surface 14. Subsequently, a heating process is performed at a temperature of approximately 300 degrees C. to 400 degrees C. to form VOH defects resulting from hydrogen implanted by proton implantation and oxygen and vacancies within the semiconductor substrate 10. This VOH defect becomes a donor (hydrogen donor). This hydrogen donor forms the FS layer 26 of the n$^+$-type.

Next, p-type impurities are doped from the back surface 14 of the semiconductor substrate 10 to form the collector layer 60 of the p$^+$-type. For example, ions of p-type impurities are implanted from the back surface 14 of the semiconductor substrate 10 at a dose amount of, for example, 5.0E+12 cm$^{-2}$ or more and 4.0E+13 cm$^{-2}$ or less. Thereafter, ions of n-type impurities are implanted by using a back-surface patterning technique at 1.0E+15 cm$^{-2}$ or more and 5.0E+15 cm$^{-2}$ or less. Further, thereafter, laser annealing is performed on an implanting surface to activate n-type and p-type impurities. Finally, the collector electrode 66 is formed on the back surface 14 of the semiconductor substrate 10. Note that the collector electrode 66 also works as a cathode electrode of the FWD section 200.

Figure 8:
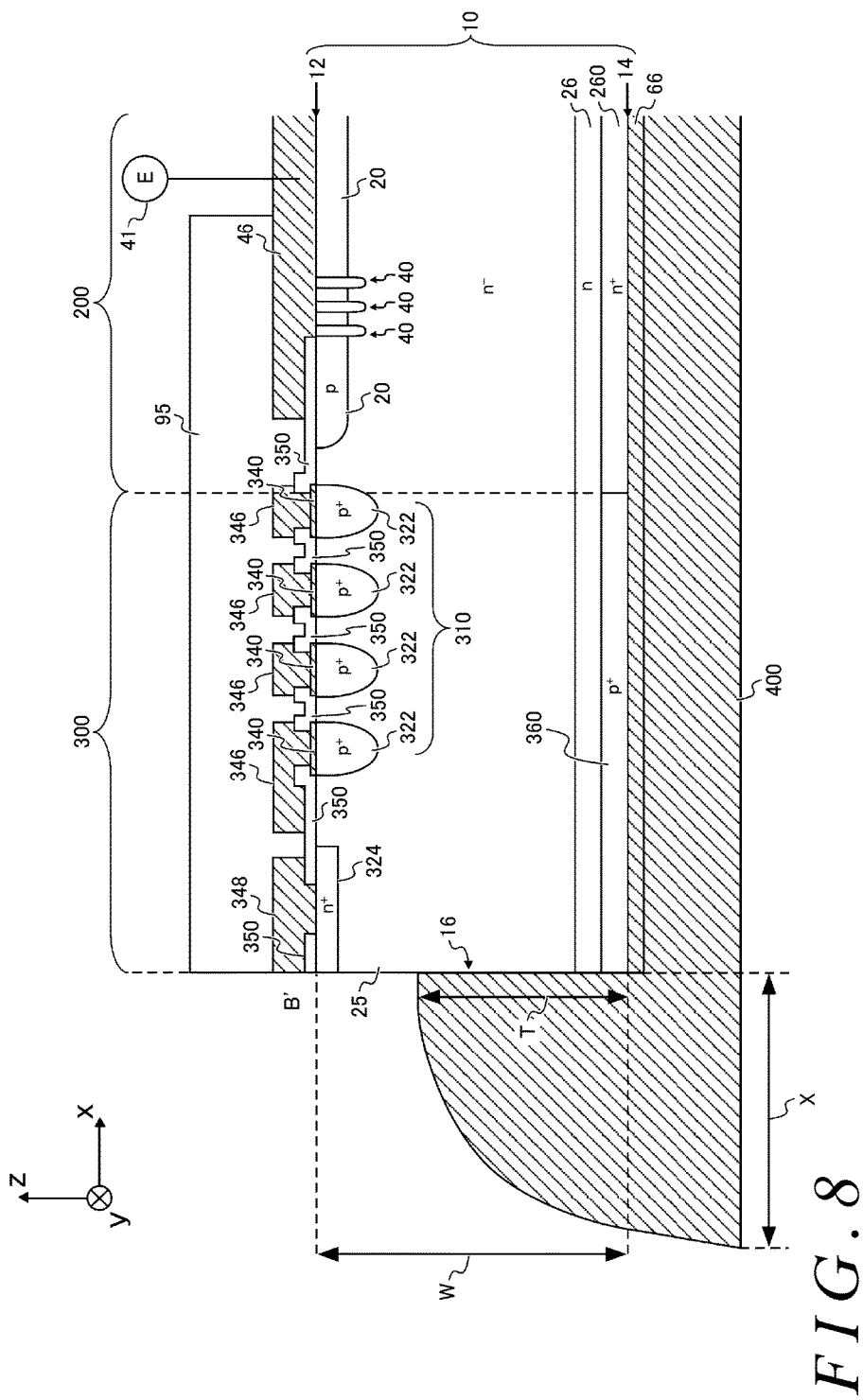
FIG. 8 is a diagram illustrating a height T and a protruding length X of the solder layer 400.

FIG. 8 is a diagram illustrating a height T and a protruding length X of the solder layer 400. The FWD section 200 of the present example surrounds the entire periphery of the IGBT section 100, thereby facilitating a heat generated in the FWD section 200 to be conveyed to a side surface 16 of the semiconductor substrate 10. Also, the FWD section 200 of the present example has a current density approximately three times higher than the IGBT section 100. Therefore, an amount of heat generation in the FWD section 200 per hour is higher than that of the IGBT section 100.

Thus, the semiconductor device 500 of the present example includes the solder layer 400 on the side surface 16 of the semiconductor substrate 10. In the present example, after forming of the collector electrode 66, the semiconductor substrate 10 is placed on the solder layer 400. This allows the solder layer 400 to be provided to directly contact the collector electrode 66 and the side surface 16 of the semiconductor substrate 10.

In the present example, the thickness of the semiconductor substrate 10 is defined as W. The thickness W of the present example is the shortest distance of the semiconductor substrate 10 from the front surface 12 to the back surface 14 in the z direction. Also, in the present example, for the solder layer 400 at the side surface 16 of the semiconductor substrate 10, a height of the solder layer 400 on the back surface 14 is defined as T. The height T of the present example is a length of the shortest straight line from the same position as the back surface 14 in the z direction to an upper end of the solder layer 400 in the +z direction. The height T of the solder layer 400 may satisfy a relationship of W/2<T. By setting the height T of the solder layer 400 to be larger than half the thickness W of the semiconductor substrate 10, a heat generated in the FWD section 200 can be released efficiency through the side surface 16.

Also, when the semiconductor device 500 is seen from a top view, a protruding length of the solder layer 400 which protrudes from the side surface 16 of the semiconductor substrate 10 to outside is defined as X. The protruding length X of the present example is a length of the shortest straight line from the side surface 16 to an end portion of the solder layer 400 in the −x direction. The height T of the solder layer 400 may satisfy a relationship of T<X. The height T of the present example satisfies T<X≤W. That is, the height T is smaller than the protruding length X, and the protruding length X is equal to or less than the thickness W. By setting the height T to be smaller than the thickness W, a short circuit between the emitter electrode 46 and the collector electrode 66 can be prevented.

Figure 9:
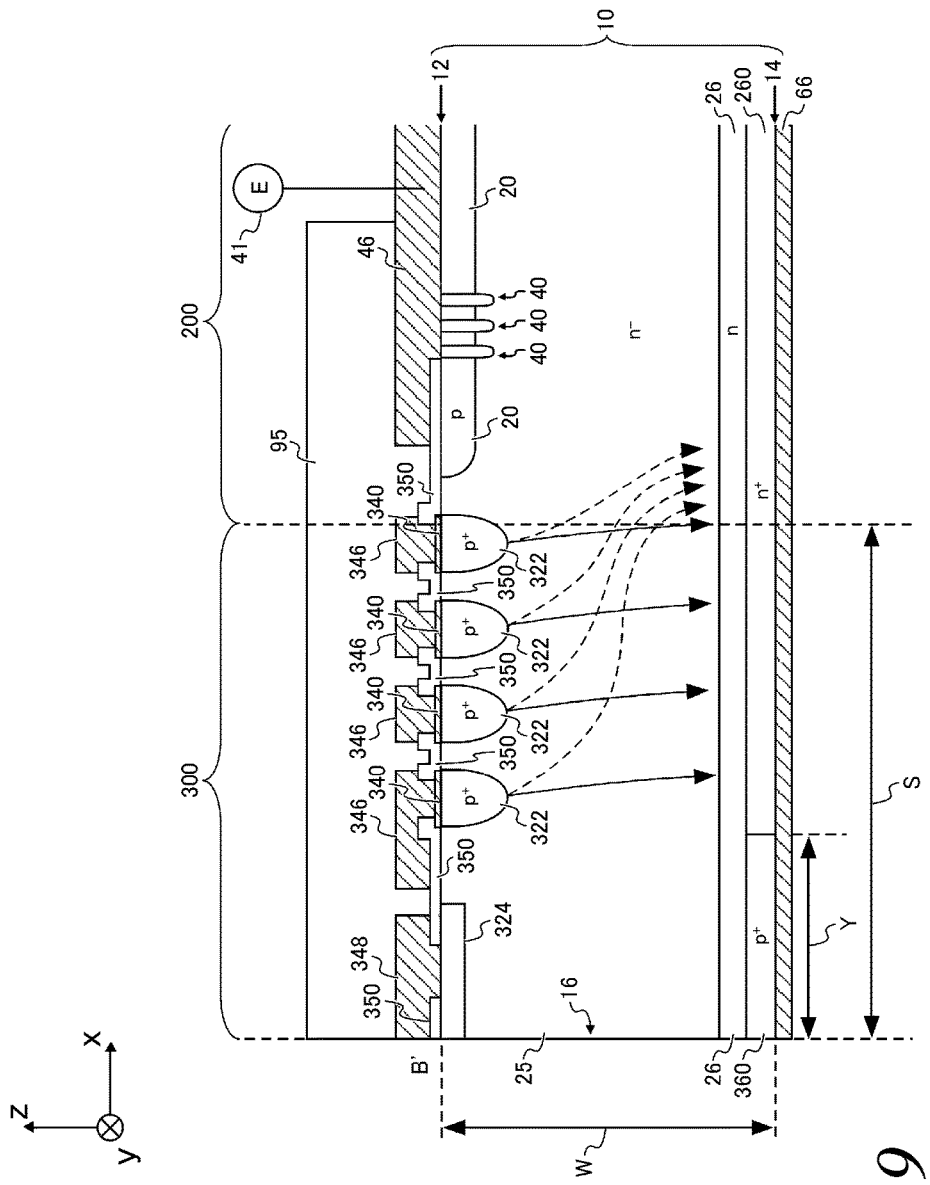
FIG. 9 is a diagram illustrating a width S of the edge termination section 300 and a width Y of the collector layer 360 of the edge termination section 300 in the second embodiment.

FIG. 9 is a diagram illustrating a width S of the edge termination section 300 and a width Y of the collector layer 360 of the edge termination section 300 in the second embodiment. In the second embodiment, the cathode layer 260 and the collector layer 360 are different from those in the first embodiment in shape. The other points may be the same as those in the first embodiment.

In the present example, the cathode layer 260 of the FWD section 200 extends to the edge termination section 300. Also, as the cathode layer 260 extends more, the width Y of the collector layer 360 of the edge termination section 300 of the present example is smaller than the width S of the edge termination section 300. For example, the width Y of the collector layer 360 is smaller than half the width S of the edge termination section 300 (that is, Y<S/2).

Note that in the present example, the width S of the edge termination section 300 is defined as a length of the shortest straight line from the side surface 16 of the semiconductor substrate 10 at the front surface 12 to an inner end portion of the innermost guard ring 322. Also, in the present example, the width Y of the collector layer 360 is defined as a length of the shortest straight line from the side surface 16 of the semiconductor substrate 10 to the boundary with the cathode layer 260.

In the present example, the width Y of the collector layer 360 is smaller than the thickness W of the semiconductor substrate 10 (that is, Y<W). Note that the thickness W of the present example is smaller than half the width S of the edge termination section 300 (that is, W<S/2). That is, in the present example, a relationship of Y<W<S/2 is satisfied.

An avalanche current may flow from the guard ring 322 to the cathode layer 260. As in the first embodiment, when the collector layer 360 extends from the side surface 16 to the boundary portion between the FWD section 200 and the edge termination section 300, the avalanche current may be biased sharply toward inside (the situation is illustrated by dashed lines). Therefore, because the avalanche current concentrates on the cathode layer 260 at the boundary portion between the FWD section 200 and the edge termination section 300, element structures may be locally broken down. On the other hand, in the present example, by making the width Y of the collector layer 360 small, the avalanche current flows into the cathode layer 260 approximately evenly. Therefore, in the present example, it is possible to prevent the element structures from local break down, as compared to the first embodiment.

Figure 10A:
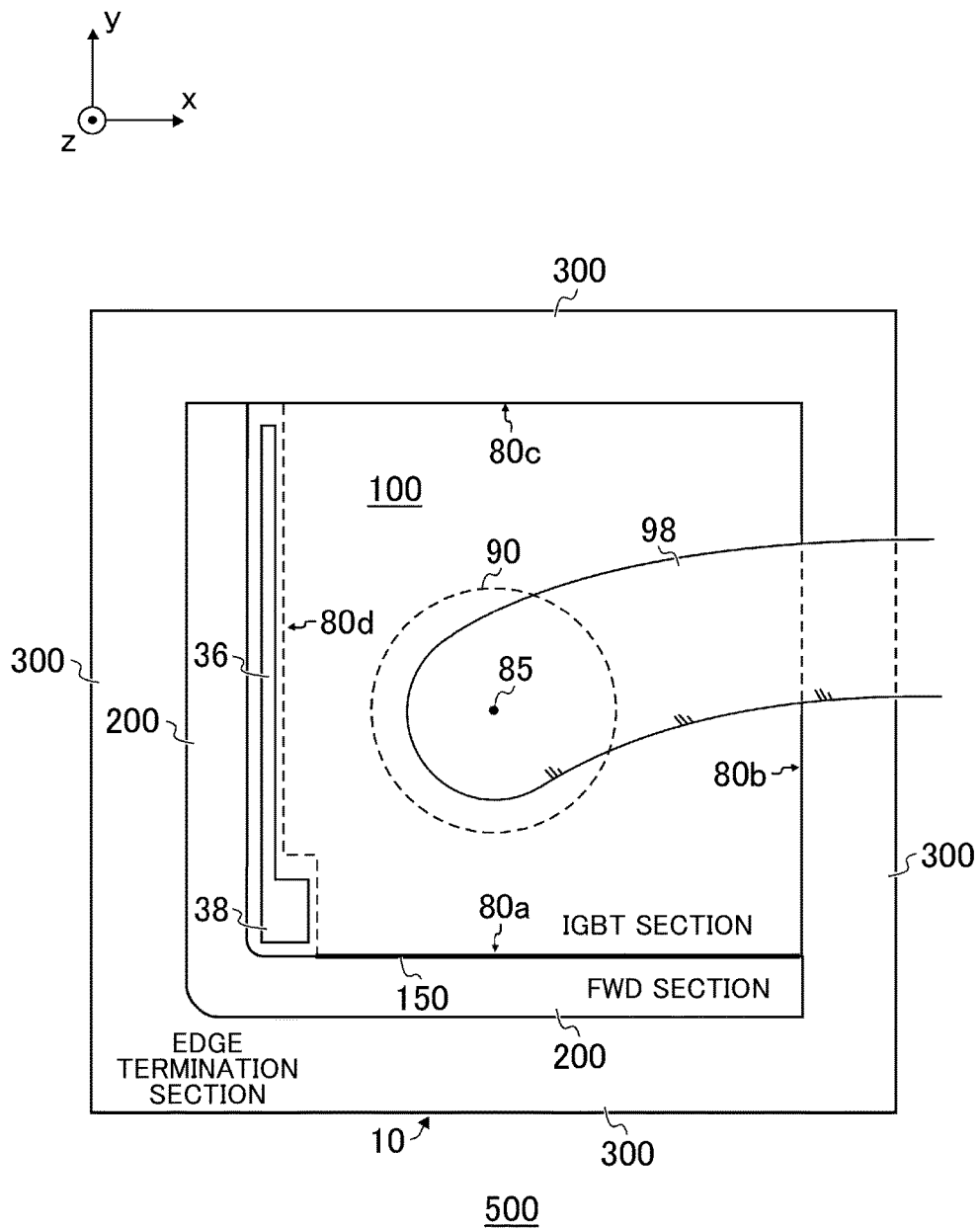
FIG. 10A is a top view of a semiconductor device 500 in the third embodiment.

FIG. 10A is a top view of the semiconductor device 500 in the third embodiment. Note that in FIG. 10A and the following figures, in consideration of visibility of the figures, the emitter electrode outer circumferential end 47 and the opening 94 are omitted. The FWD section 200 of the present example is only opposite to two sides 80 of the IGBT section 100 in different directions. The present example is different from the first embodiment in this point. However, the other points may be the same as those in the first embodiment, or may be a combination of the present example and the second embodiment. The FWD section 200 of the present example is, when the semiconductor device 500 is seen from a top view, only opposite to the side 80*a* and the side 80*d* of the IGBT section 100. In the present example, the boundary region 150 between the IGBT section 100 and the FWD section 200 includes only one side. As described above, when the gate runner section 36 is positioned therebetween, the boundary region 150 is not considered to exist.

Figure 10B:
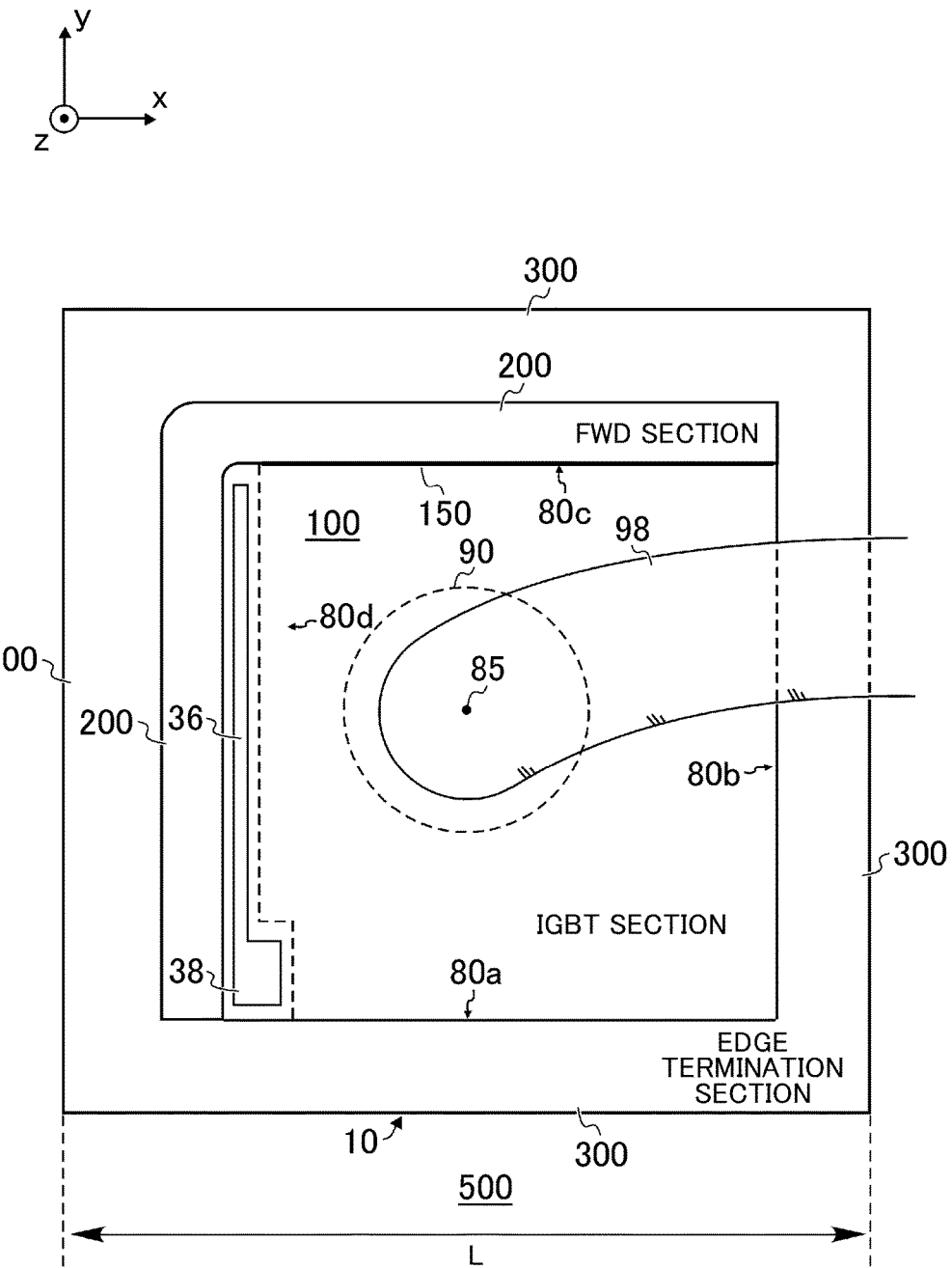
FIG. 10B is a diagram illustrating a first modification example of the third embodiment.

FIG. 10B is a diagram illustrating a first modification example of the third embodiment. The FWD section 200 of the present example is, when the semiconductor device 500 is seen from a top view, only opposite to the side 80*d* and the side 80*c* of the IGBT section 100. In the present example, the boundary region 150 between the IGBT section 100 and the FWD section 200 includes only one side.

Figure 10C:
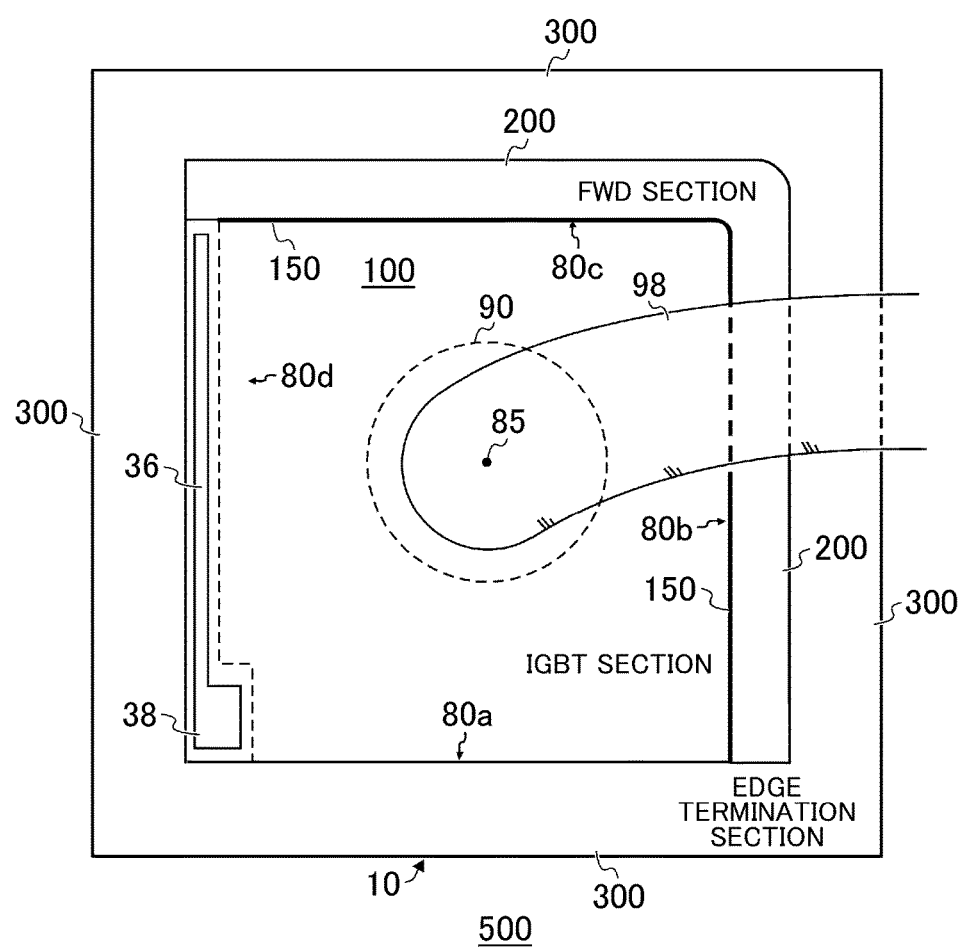
FIG. 10C is a diagram illustrating a second modification example of the third embodiment.

FIG. 10C is a diagram illustrating a second modification example of the third embodiment. The FWD section 200 of the present example is, when the semiconductor device 500 is seen from a top view, only opposite to the side 80*c* and the side 80*b* of the IGBT section 100. In the present example, the boundary region 150 between the IGBT section 100 and the FWD section 200 includes two sides.

Figure 10D:
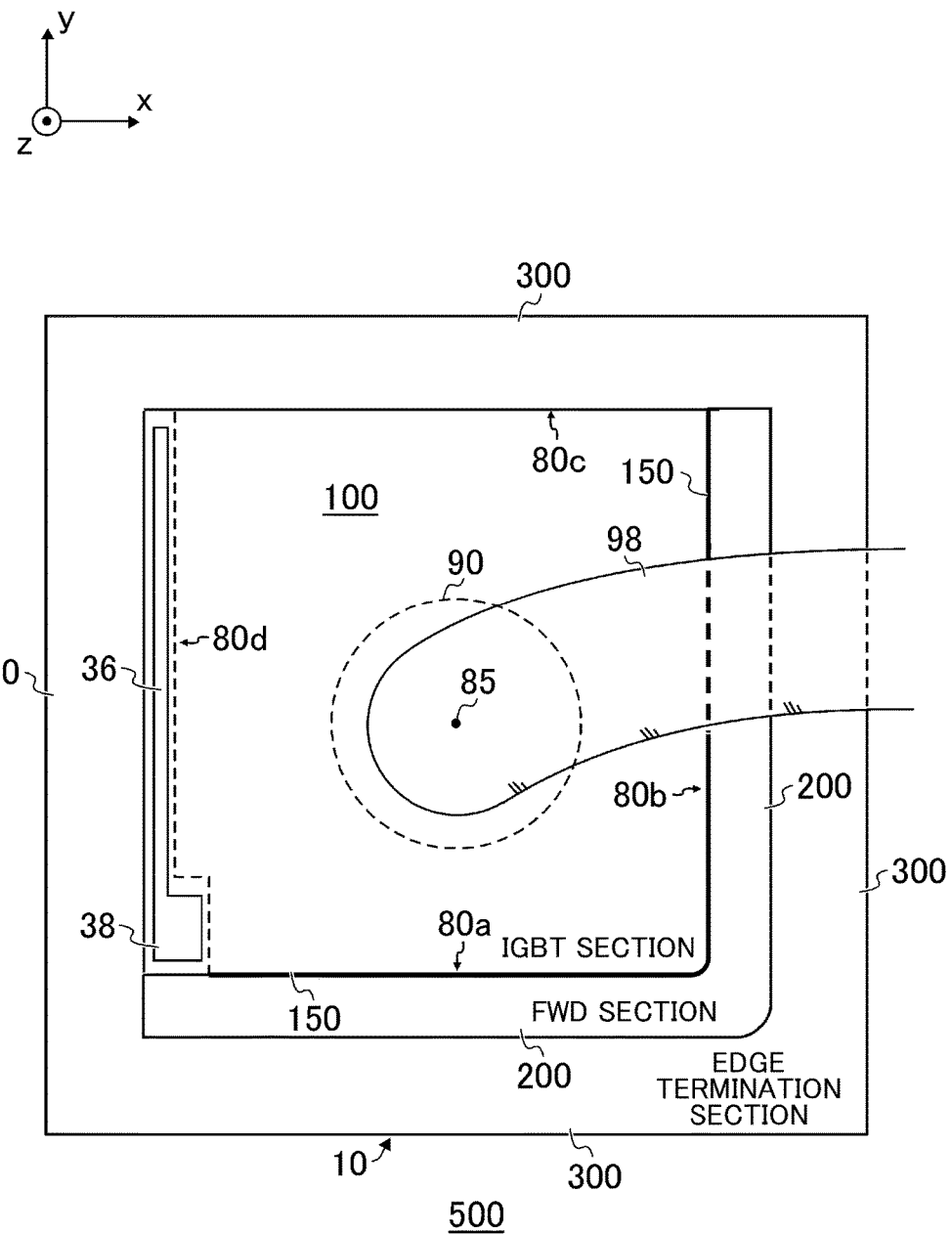
FIG. 10D is a diagram illustrating a third modification example of the third embodiment.

FIG. 10D is a diagram illustrating a third modification example of the third embodiment. The FWD section 200 of the present example is, when the semiconductor device 500 is seen from a top view, only opposite to the side 80*b* and the side 80*a* of the IGBT section 100. In the present example, the boundary region 150 between the IGBT section 100 and the FWD section 200 includes two sides.

Figure 11A:
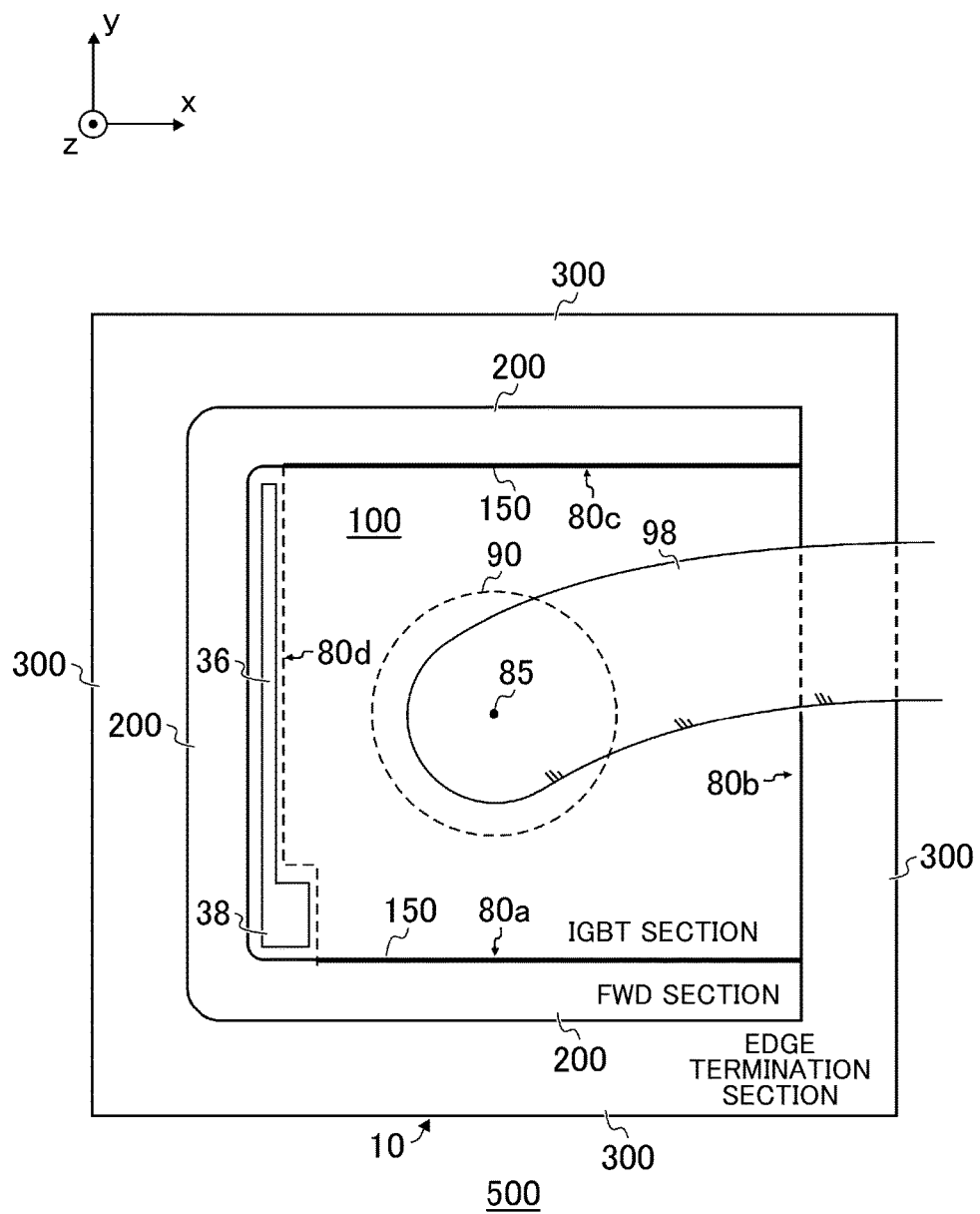
FIG. 11A is a top view of the semiconductor device 500 in a fourth embodiment.

FIG. 11A is a top view of the semiconductor device 500 in a fourth embodiment. The FWD section 200 of the present example is shaped to have a notch on one side of four sides of a rectangular ring shape. The present example is different from the first embodiment in this point. However, the other points may be the same as those in the first embodiment, or may be a combination of the present example and the second embodiment. The FWD section 200 of the present example is, when the semiconductor device 500 is seen from a top view, only opposite to the side 80*a*, the side 80*c* and the side 80*d* of the IGBT section 100. In the present example, the boundary region 150 between the IGBT section 100 and the FWD section 200 includes two sides.

Figure 11B:
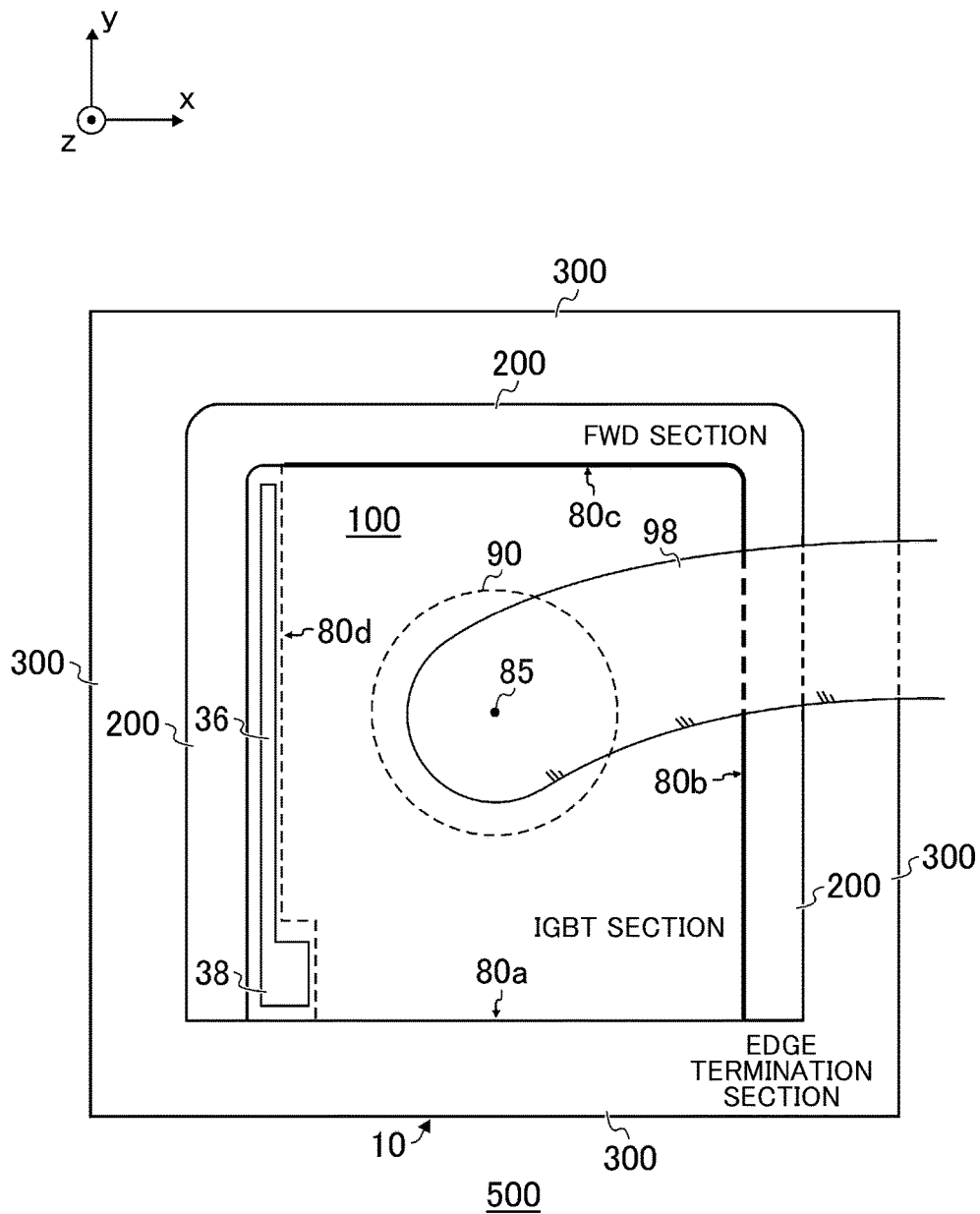
FIG. 11B is a diagram illustrating a first modification example of the fourth embodiment.

FIG. 11B is a diagram illustrating a first modification example of the fourth embodiment. The FWD section 200 of the present example is, when the semiconductor device 500 is seen from a top view, only opposite to the side 80*b*, the side 80*c* and the side 80*d* of the IGBT section 100. In the present example, the boundary region 150 between the IGBT section 100 and the FWD section 200 includes two sides.

Figure 11C:
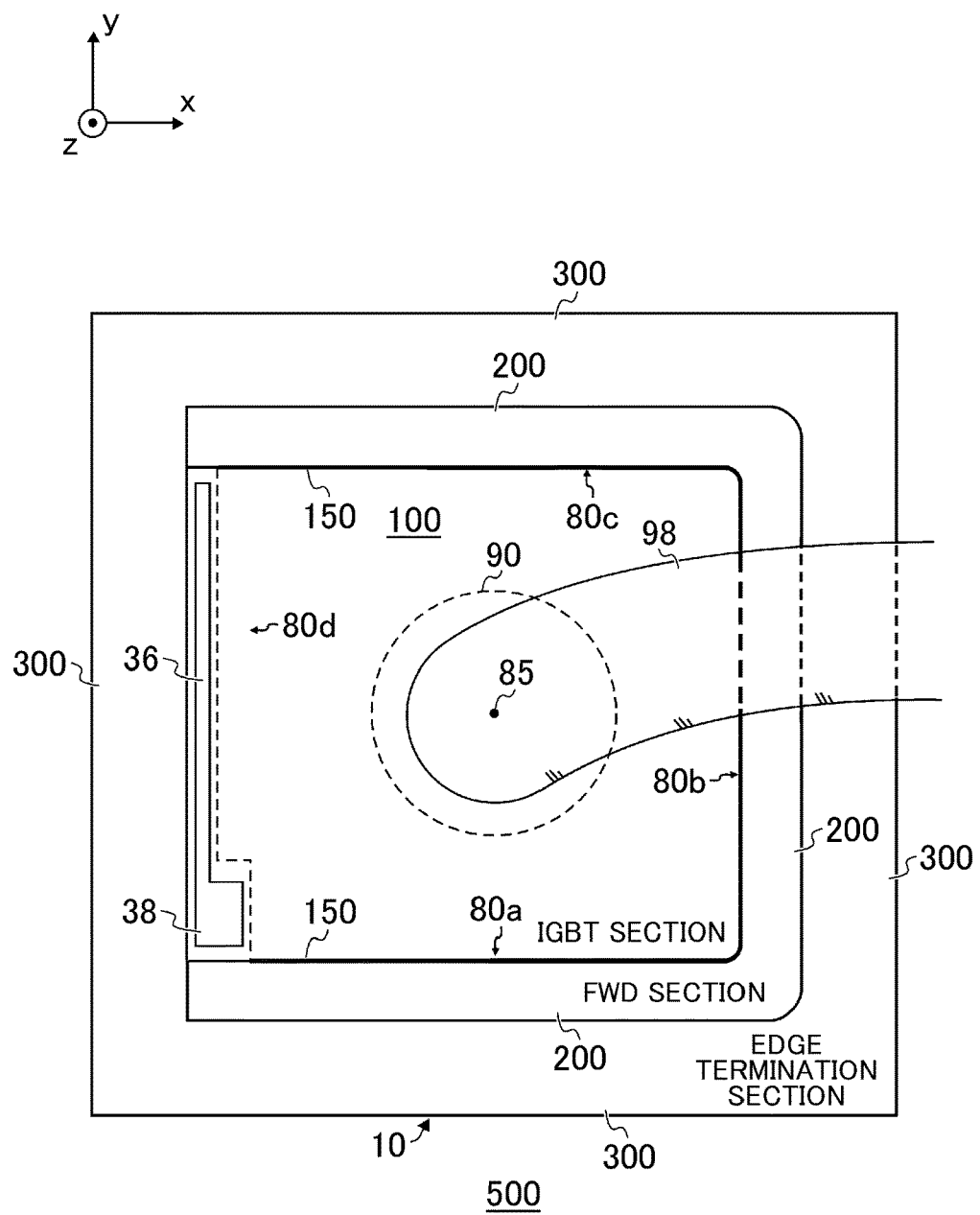
FIG. 11C is a diagram illustrating a second modification example of the fourth embodiment.

FIG. 11C is a diagram illustrating a second modification example of the fourth embodiment. The FWD section 200 of the present example is, when the semiconductor device 500 is seen from a top view, only opposite to the side 80*a*, the side 80*b* and the side 80*c* of the IGBT section 100. In the present example, the boundary region 150 between the IGBT section 100 and the FWD section 200 includes three sides.

Figure 11D:
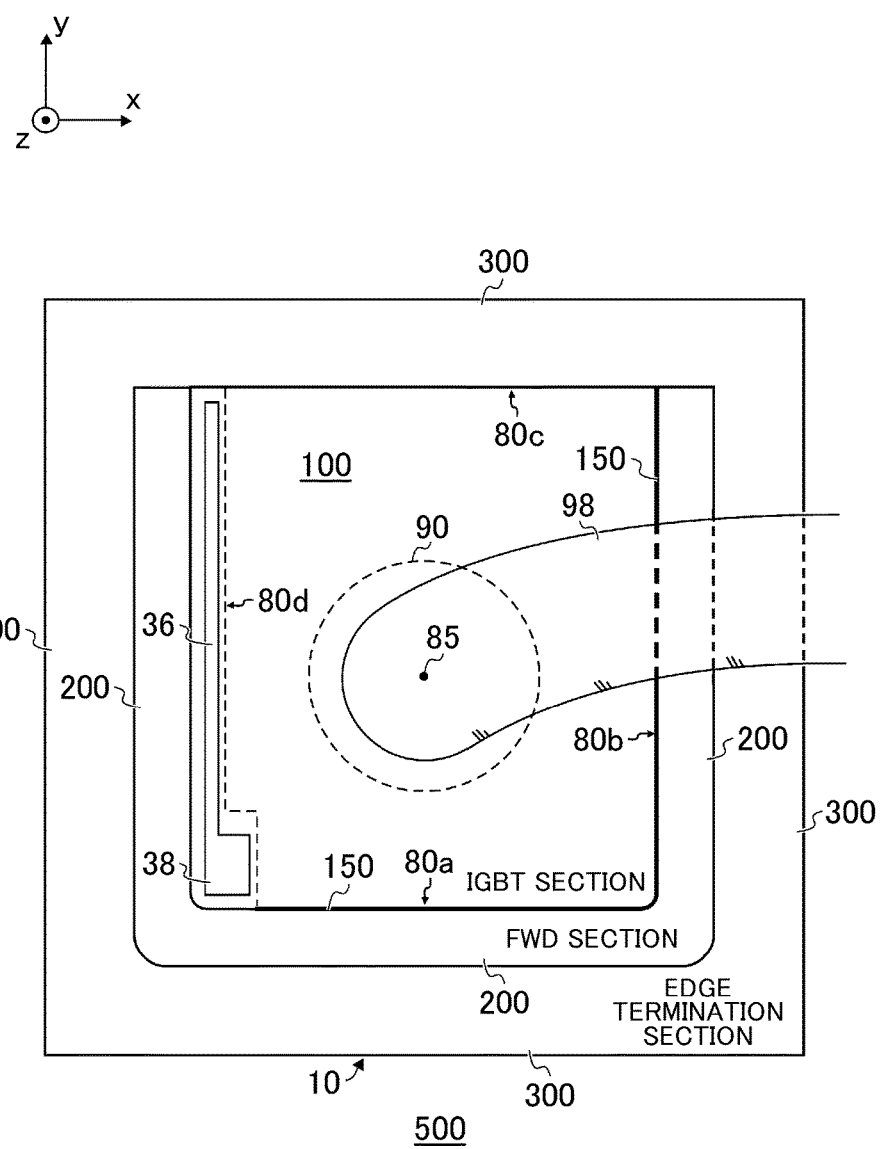
FIG. 11D is a diagram illustrating a third modification example of the fourth embodiment.

FIG. 11D is a diagram illustrating a third modification example of the fourth embodiment. The FWD section 200 of the present example is, when the semiconductor device 500 is seen from a top view, only opposite to the side 80*a*, the side 80*b* and the side 80*d* of the IGBT section 100. In the present example, the boundary region 150 between the IGBT section 100 and the FWD section 200 includes two sides.

Figure 12A:
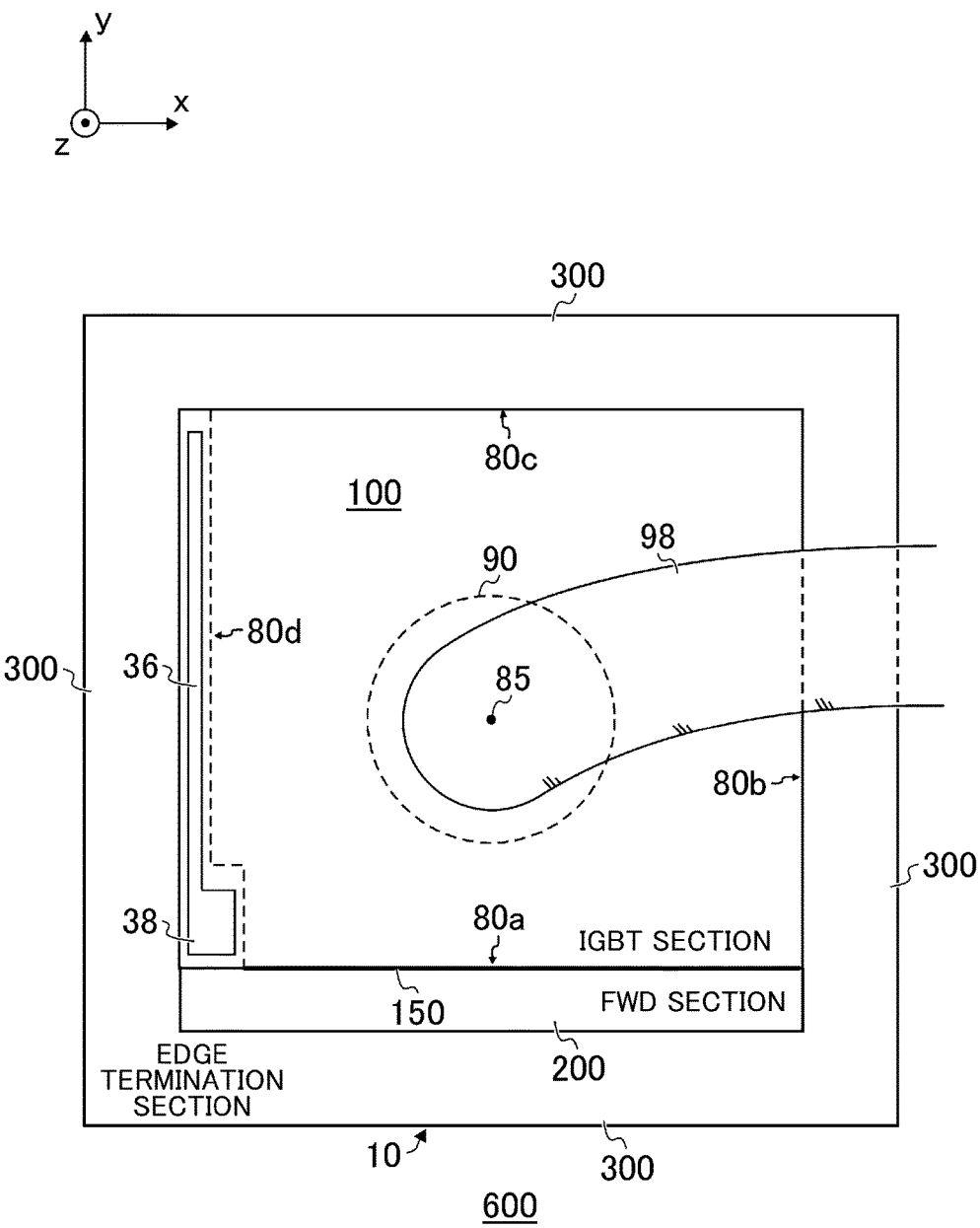
FIG. 12A is a top view of a semiconductor device 600 in a fifth embodiment.

FIG. 12A is a top view of a semiconductor device 600 in a fifth embodiment. The FWD section 200 of the present example has a straight shape. The present example is different from the first embodiment in this point. However, the other points may be the same as those in the first embodiment, or may be a combination of the present example and the second embodiment. The FWD section 200 of the present example is, when the semiconductor device 500 is seen from a top view, only opposite to the side 80*a* of the IGBT section 100. In the present example, the boundary region 150 between the IGBT section 100 and the FWD section 200 includes one side.

Figure 12B:
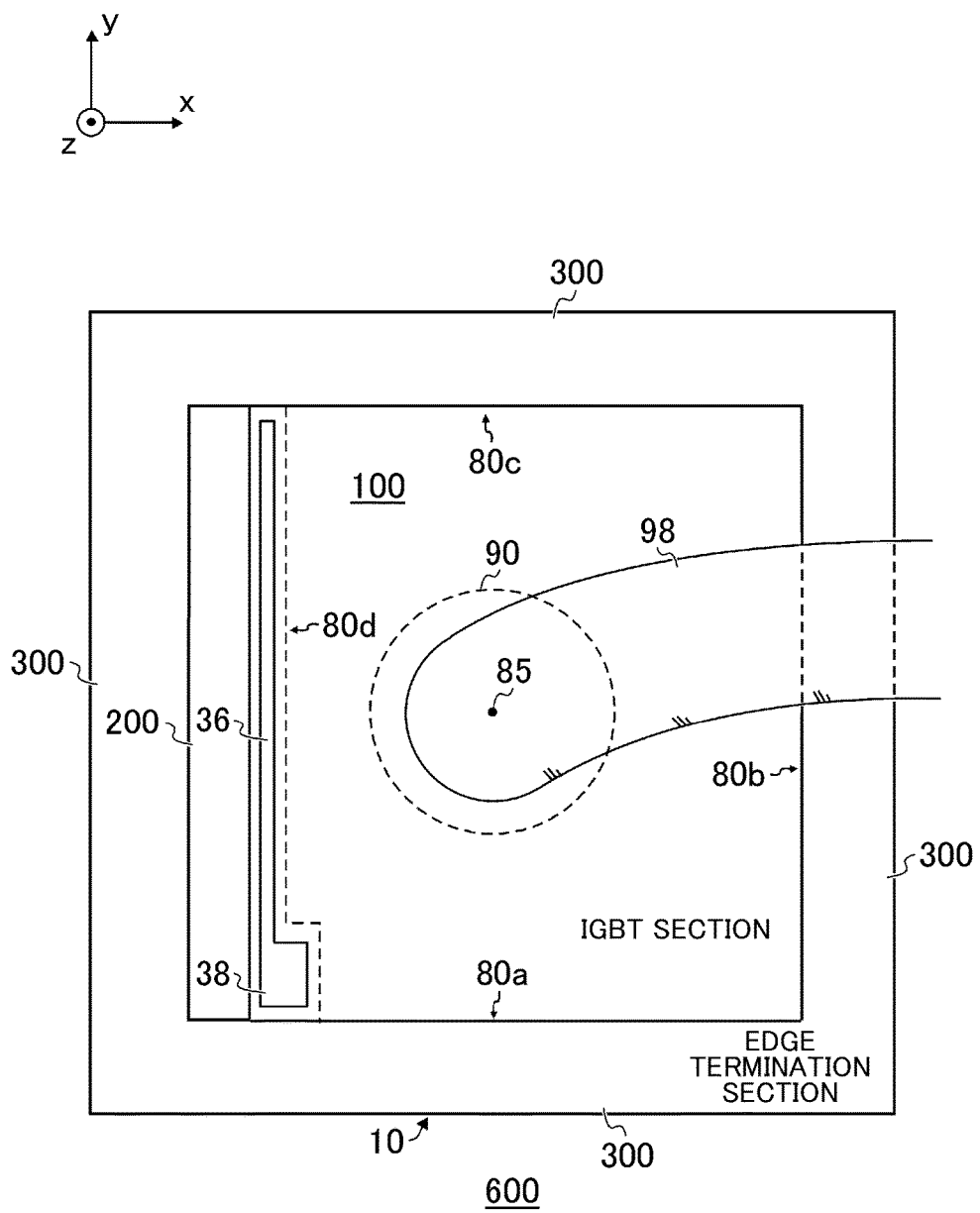
FIG. 12B is a diagram illustrating a first modification example of the fifth embodiment.

FIG. 12B is a diagram illustrating a first modification example of the fifth embodiment. The FWD section 200 of the present example is, when the semiconductor device 500 is seen from a top view, only opposite to the side 80*d* of the IGBT section 100. In the present example, the boundary region 150 between the IGBT section 100 and the FWD section 200 does not exist.

Figure 12C:
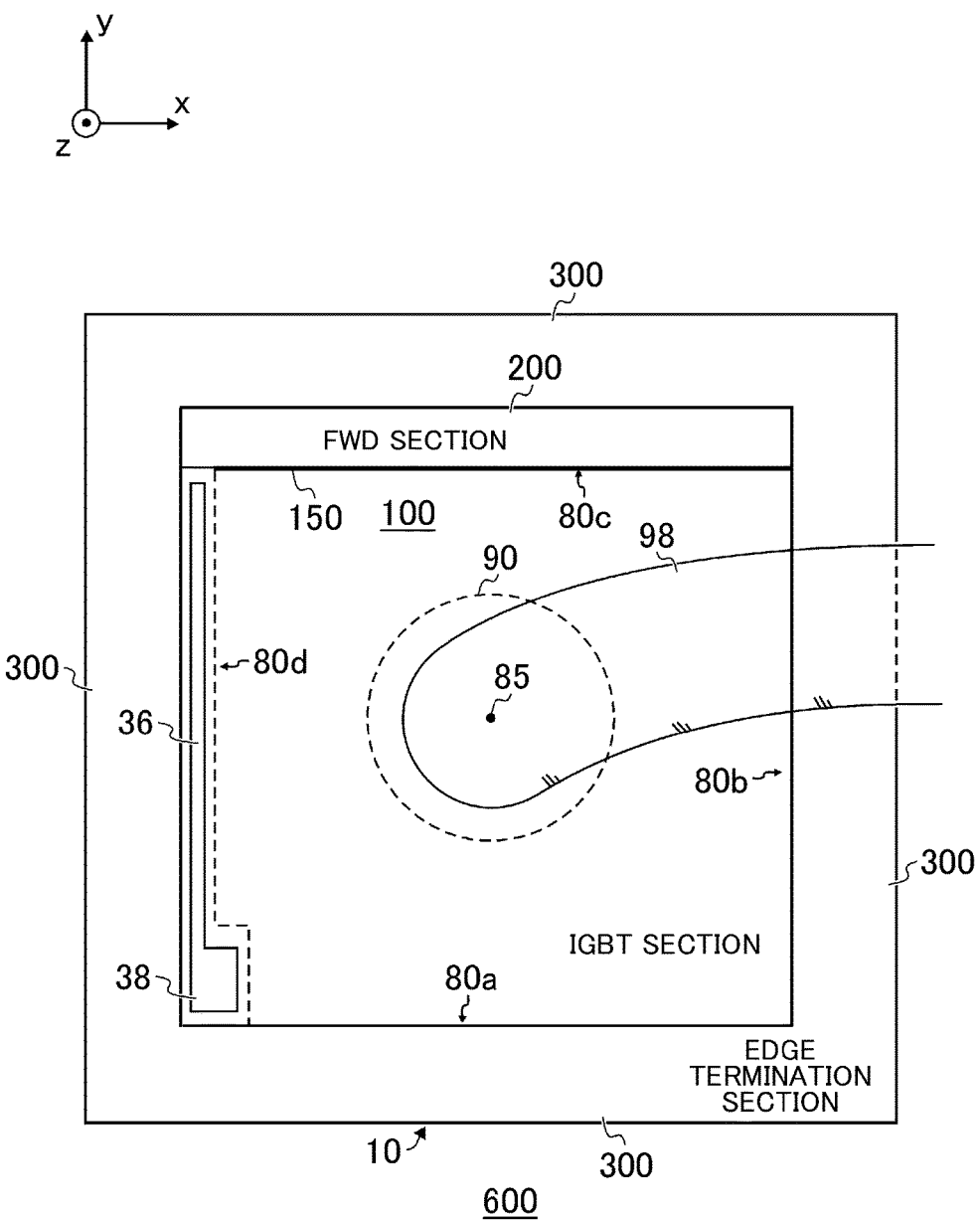
FIG. 12C is a diagram illustrating a second modification example of the fifth embodiment.

FIG. 12C is a diagram illustrating a second modification example of the fifth embodiment. The FWD section 200 of the present example is, when the semiconductor device 500 is seen from a top view, only opposite to the side 80*c* of the IGBT section 100. In the present example, the boundary region 150 between the IGBT section 100 and the FWD section 200 includes one side.

Figure 12D:
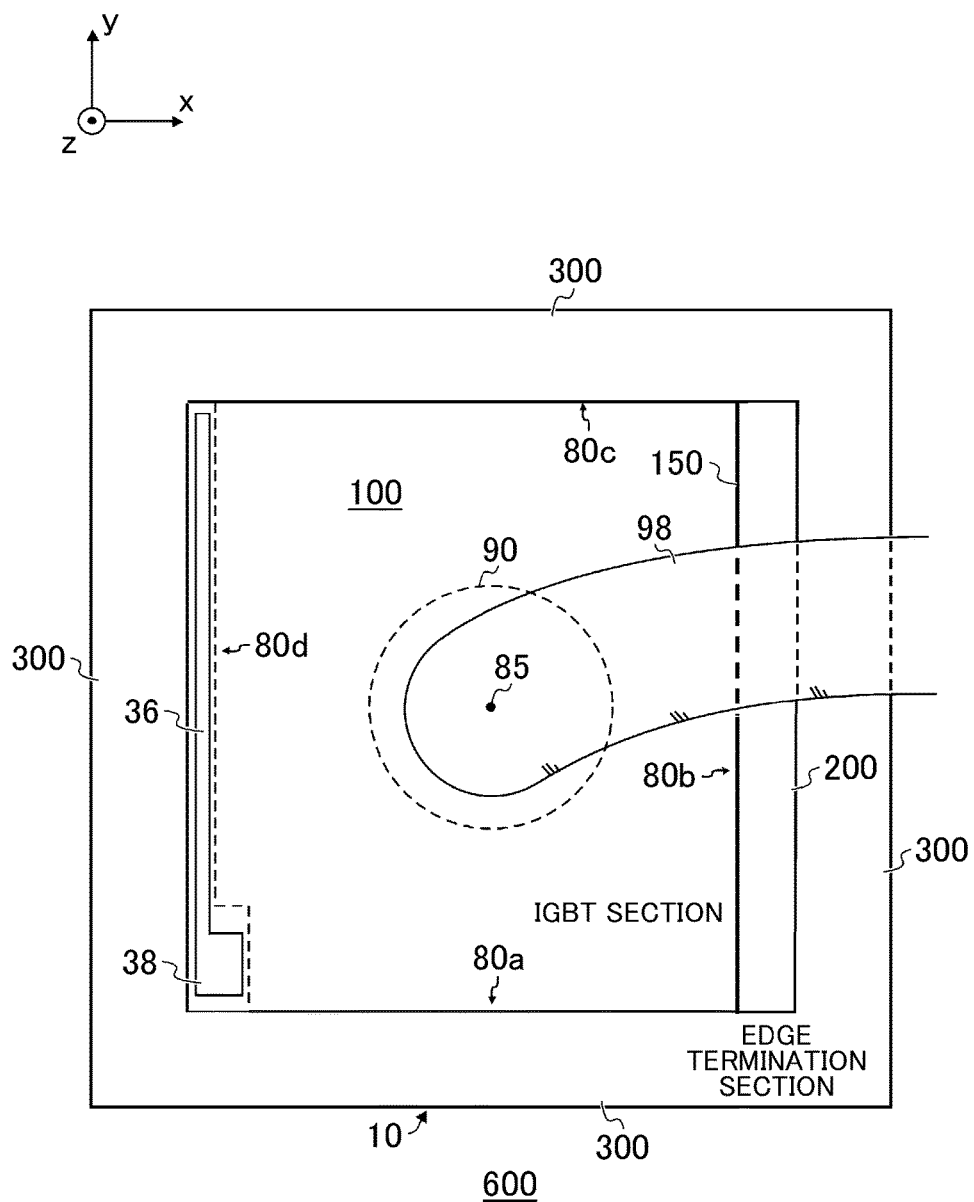
FIG. 12D is a diagram illustrating a third modification example of the fifth embodiment.

FIG. 12D is a diagram illustrating a third modification example of the fifth embodiment. The FWD section 200 of the present example is, when the semiconductor device 500 is seen from a top view, only opposite to the side 80*b* of the IGBT section 100. In the present example, the boundary region 150 between the IGBT section 100 and the FWD section 200 includes one side.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: front surface, 14: back surface, 16: side surface, 20: base region, 21: channel forming region, 22: emitter region, 23: p$^+$-type well region, 24: contact region, 25: drift region, 26: FS layer, 30: gate trench section, 31: gate terminal, 32: gate electrode, 34: gate insulating film, 36: gate runner section, 38: gate pad section, 39: p$^+$-type well region, 40: emitter trench section, 41: emitter terminal, 42: trench electrode, 44: trench insulating film, 46: emitter electrode, 47: emitter electrode outer circumferential end, 50: interlayer insulating film, 52: opening, 54: plug, 60: collector layer, 61: collector terminal, 66: collector electrode, 80: side, 85: center, 90: wiring region, 94: opening, 95: passivation film, 98: wiring section, 100: IGBT section, 150: boundary region, 200: FWD section, 260: cathode layer, 300: edge termination section, 310: guard ring structure, 322: guard ring, 324: channel stopper region, 340: polysilicon layer, 346: electrode layer, 348: electrode layer, 350: insulating film, 360: collector layer, 400: solder layer, 500, 600: semiconductor device

What is claimed is:

1. A semiconductor chip comprising:
   a transistor section including a plurality of transistors;
   a free wheeling diode section being at least opposite to one side of the transistor section and provided outside the transistor section, when the transistor section is seen from a top view; and
   a gate runner section and a gate pad section provided to contact the transistor section and not surrounding an entire periphery of the transistor section, when the transistor section is seen from a top view.

2. The semiconductor chip according to claim 1, wherein the free wheeling diode section is not provided inside the transistor section, when the transistor section is seen from a top view.

3. The semiconductor chip according to claim 1, wherein the free wheeling diode section is provided serially outside the transistor section, the gate runner section and the gate pad section, when the transistor section is seen from a top view.

4. The semiconductor chip according to claim 3, wherein the free wheeling diode section is shaped to have a notch on one side of four sides of a rectangular ring shape.

5. The semiconductor chip according to claim 3, wherein the free wheeling diode section is provided to surround the entire periphery of the transistor section.

6. The semiconductor chip according to claim 1, further comprising an edge termination section positioned outside the free wheeling diode section, when the transistor section is seen from a top view, wherein
   the free wheeling diode section includes an emitter trench section at a position which overlaps with an insulating film extending from the edge termination section.

7. The semiconductor chip according to claim 1, further comprising a wiring section electrically communicating with outside of the semiconductor chip, and provided inside the transistor section, when the transistor section is seen from a top view.

8. The semiconductor chip according to claim 1, further comprising:
   a semiconductor substrate provided with the transistor section and the free wheeling diode section; and
   a solder layer provided to directly contact a back surface electrode provided on a back surface of the semiconductor substrate and a side surface of the semiconductor substrate, wherein
   a thickness W of the semiconductor substrate and a height T of the solder layer on the back surface of the semiconductor substrate at the side surface of the semiconductor substrate satisfy a relationship of W/2<T.

9. The semiconductor chip according to claim 8, wherein a protruding length X of the solder layer protruding from the side surface to the outside of the semiconductor substrate, when the transistor section is seen from a top view, and the height T of the solder layer satisfy a relationship of T<X.

10. The semiconductor chip according to claim 6, wherein the free wheeling diode section includes an n-type cathode layer extending to the edge termination section.

11. The semiconductor chip according to claim 10, wherein the edge termination section includes a p-type collector layer smaller than a width of the edge termination section.

12. The semiconductor chip according to claim 10, wherein a width of a p-type collector layer of the edge termination section is smaller than a thickness of a semiconductor substrate provided with the transistor section and the free wheeling diode section.

13. The semiconductor chip according to claim 1, wherein a boundary region between the transistor section and the free wheeling diode section has a total length 3.0 times or less greater than a length of one side of the semiconductor device.

14. The semiconductor chip according to claim 1, wherein the semiconductor chip is an RC-IGBT (Reverse Conducting-IGBT).

* * * * *